(12) United States Patent
Nakatsuka et al.

(10) Patent No.: US 7,259,498 B2
(45) Date of Patent: Aug. 21, 2007

(54) PIEZOELECTRIC RESONATOR, FILTER, AND DUPLEXER

(75) Inventors: Hiroshi Nakatsuka, Katano (JP); Keiji Onishi, Settsu (JP); Hiroyuki Nakamura, Katano (JP); Takehiko Yamakawa, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 65 days.

(21) Appl. No.: 10/938,537

(22) Filed: Sep. 13, 2004

(65) Prior Publication Data

US 2005/0057117 A1 Mar. 17, 2005

(30) Foreign Application Priority Data

Sep. 17, 2003 (JP) ............................. 2003-324399

(51) Int. Cl.
H01L 41/09 (2006.01)
H03H 9/17 (2006.01)

(52) U.S. Cl. ..................... 310/324; 310/320; 310/335

(58) Field of Classification Search ................ 310/320, 310/324, 335
See application file for complete search history.

(56) References Cited

U.S. PATENT DOCUMENTS

| | | | | |
|---|---|---|---|---|
| 4,456,850 A | * | 6/1984 | Inoue et al. | ................ 310/324 |
| 5,821,833 A | * | 10/1998 | Lakin | .......................... 333/187 |
| 2004/0056735 A1 | * | 3/2004 | Nomura et al. | ............. 333/133 |

FOREIGN PATENT DOCUMENTS

| | | | |
|---|---|---|---|
| JP | 59-200518 | * | 11/1984 |
| JP | 60-68711 | | 4/1985 |
| JP | 60-142607 | | 7/1985 |
| JP | 63-82116 | | 4/1988 |
| JP | 2-51908 | * | 2/1990 |
| JP | 2004304704 A | * | 10/2004 |

OTHER PUBLICATIONS

K.M. Lakin, et al., "Temperature Compensated Bulk Acoustic Thin Film Resonators", TFR Technologies, Inc., 2000 IEEEE Ultrasonics Symposium, pp. 855-858.

* cited by examiner

*Primary Examiner*—J San Martin
(74) *Attorney, Agent, or Firm*—Wenderoth, Lind & Ponack, L.L.P.

(57) ABSTRACT

A piezoelectric resonator of the present invention is structured such that on a substrate 5 having a cavity 4 formed therein, a lower electrode 3, a piezoelectric body 1, a spurious component control layer 16, and an upper electrode 2 are formed in this order from bottom up. The spurious component control layer 16 is a layer for controlling a spurious frequency, and composed of, for example, a metallic material, a dielectric material, or a piezo electric material. By additionally providing the spurious component control layer 16, it is made possible to cause variation of the spurious frequency due to unwanted variation to become greater than variation in resonance frequency of the main resonance of the piezoelectric resonator. Thus, it is possible to realize a piezoelectric resonator having an admittance frequency response where no spurious component occurs between resonance frequency fr and antiresonance frequency fa.

24 Claims, 21 Drawing Sheets

PIEZOELECTRIC RESONATOR, FILTER, AND DUPLEXER

BACKGROUND OF THE INVENTION

1. Field of the Invention

The present invention relates to a piezoelectric resonator, and more particularly to a piezoelectric resonator capable of suppressing occurrence of spurious components, a filter using the same piezoelectric resonator, and a duplexer using the same piezoelectric resonator.

2. Description of the Background Art

Elements included in an electronic apparatus such as a portable apparatus are required to be reduced in size and weight. For example, a filter for use in a portable apparatus is required to be precisely adjustable for a frequency response as well as to be reduced in size. As an exemplary filter which satisfies the above requirements, a filter using a piezoelectric resonator is known (for example, see Japanese Laid-Open Patent Publication No. 60-68711).

Hereinafter, referring to FIGS. 10A-10D, a conventional piezoelectric resonator will be described. FIG. 10A is a cross-sectional view showing a basic structure of a conventional piezoelectric resonator 500. The piezoelectric resonator 500 is structured by sandwiching a piezoelectric body 501 between upper and lower electrodes 502 and 503. The piezoelectric resonator 500 is mounted on a substrate 505 having a cavity 504 formed therein. The cavity 504 can be formed by using a micromachining method to partially etch the substrate 505 from its back side. The piezoelectric resonator 500 is caused to vibrate in a thickness direction when the upper and lower electrodes 502 and 503 apply electric fields in the thickness direction. Next, an operation of the piezoelectric resonator 500 is described in conjunction with longitudinal vibration in the thickness direction of an infinite plate.

FIG. 10B is a schematic perspective view used for explaining the operation of the conventional piezoelectric resonator 500. In the piezoelectric resonator 500, if electric fields are applied between the upper and lower electrodes 502 and 503, electrical energy is converted into mechanical energy in the piezoelectric body 501. Mechanical vibration is induced in the thickness direction, and the induced vibration expands and contracts in the same direction as that of the electric fields. The piezoelectric resonator 500 generally utilizes resonant vibration in the thickness direction of the piezoelectric body 501, and resonates at a frequency whose ½ wavelength is equal to the thickness of the piezoelectric resonator 500. The cavity 504 shown in FIG. 10A is provided to ensure that the longitudinal vibration occurs in the thickness direction of the piezoelectric body 501.

As shown in FIG. 10D, an equivalent circuit of the piezoelectric resonator 500 has both a series resonance portion and a parallel resonance portion. In the equivalent circuit, the series resonance portion consists of a capacitor C1, an inductor L1, and a resistor R1, and a capacitor C0 is connected in parallel to the series resonance portion. In this circuit configuration, as shown in FIG. 10C, an admittance frequency response of the equivalent circuit is such that the admittance is maximized at a resonance frequency fr, and minimized at an antiresonance frequency fa. Here, the resonance frequency fr and the antiresonance frequency fa are, in the following relationship.

$$fr = 1/\{2\pi\sqrt{(L1 \times C1)}\}$$

$$fa = fr\sqrt{(1+C1/C0)}$$

It is known that in the case of applying the piezoelectric resonator 500 as described above to a filter, it is necessary to increase the size of an electrode as much as possible from the viewpoint of impedance match (for example, see Japanese Laid-Open Patent Publication No. 60-142607).

However, if the electrode size is increased, a contact area between the electrode and the substrate is inevitably increased in order to ensure strength, so that spurious components are readily excited. In actuality, the piezoelectric resonator is partially fixed on the substrate, and therefore does not entirely produce free longitudinal vibration in the thickness direction.

As shown in FIG. 11, vibrating portions are classified into a portion A vibrating with one end fixed and a portion B with two ends that freely vibrate. In the portion A, vibration occurs at a resonance frequency f2, while in the portion B, vibration occurs at a resonance frequency f1 (FIG. 11 shows ideal vibration displacement distribution under the above boundary conditions of the portions A and B). Accordingly, if the electrode size is increased, the piezoelectric resonator is susceptible to, for example, vibration in the portion A, as well as to a fundamental mode (a ½ wavelength mode, the frequency f1) of desired vibration in the thickness direction, and therefore unwanted vibration readily occurs in the vicinity of a main resonance frequency (f1). This means that energy essentially used for excitation of vibration in the piezoelectric body is partially lost due to vibration leakage.

Such unwanted vibration occurs because there is an extremely small difference in resonance frequency between the portion A (the resonance frequency f2) and the portion B (the resonance frequency f1), and vibration leakage in the portion A of the substrate causes excitation of spurious vibration. For example, if resonant vibration occurs in the portion B, the fixed end of the portion A (a contact point 501a) restricts vibration of the portion B, and vibration of the portion A caused by the vibration of the portion B causes spurious components to occur in the vicinity of a resonance frequency of the are B. If the caused unwanted vibration, i.e., a spurious frequency, is present between the resonance frequency fr and the antiresonance frequency fa, a spurious component 130 appears as shown in FIG. 12A.

If a filter is formed by connecting piezoelectric resonators, which produce the spurious component 130, in parallel as shown in FIG. 12B, undesirable pass characteristics appear in a portion 140 of a passband as shown in FIG. 12C. Such pass characteristics lead to degradation of communication quality.

SUMMARY OF THE INVENTION

Therefore, an object of the present invention is to provide a piezoelectric resonator capable of preventing unwanted vibration due to vibration leakage, thereby suppressing occurrence of spurious components, a filter using the same piezoelectric resonator, and a duplexer using the same piezoelectric resonator.

The present invention is directed to a piezoelectric resonator vibrating at a predetermined frequency. To attain the above object, the piezoelectric resonator of the present invention includes a piezoelectric body, an upper electrode, a lower electrode, a spurious component control layer, and a substrate. The upper electrode is formed in a direction of a top surface of the piezoelectric body. The lower electrode is formed in a direction of a bottom surface of the piezoelectric body. The spurious component control layer is formed in order to prevent spurious components from occurring between a resonance frequency and an antiresonance frequency. The substrate has laminated thereon the piezoelectric body, the upper electrode, the lower electrode, and the spurious component control layer. Note that a second piezoelectric body may be formed on a top surface of the upper electrode, and a second upper electrode may further be formed on a top surface of the second piezoelectric body.

The spurious component control layer may be provided in a position between the upper electrode and the piezoelectric body, in a position between the piezoelectric body and the lower electrode, in a position on a top surface of the upper electrode, or in a position between the lower electrode and the substrate. Alternatively, the spurious component control layer maybe provided in one or more positions listed above. In the case where the spurious component control layer is provided in a plurality of positions, it is preferred that the spurious component control layers are different in material from each other. Also, it is preferred that the thickness of the spurious component control layers is less than or equal to one-fifth of the thickness of the piezoelectric body. Typically, the spurious component control layers each are composed of a metallic material, a dielectric material, or a piezoelectric material different from a material of the piezoelectric body.

Normally, the substrate has a cavity in a portion covered by the lower electrode. The cavity is formed without penetrating the substrate or formed so as to penetrate the substrate. Note that instead of forming the cavity, an acoustic mirror may be provided between the lower electrode and the substrate. The acoustic mirror is structured by alternately laminating a high acoustic impedance layer and a low acoustic impedance layer.

Although the above-described piezoelectric resonator of the present invention by itself acts as a filter, if two or more piezoelectric resonators are connected in a ladder form, it is possible to realize a filter with various frequency responses. Also, a duplexer can be structured by using filters of this type as transmission and reception filters, respectively, together with a phase-shift circuit.

As described above, the present invention allows variation of the spurious frequency to become greater than variation of a resonance frequency and variation of an antiresonance frequency, making it possible to remove the spurious components from between the resonance frequency and the antiresonance frequency without causing the resonance frequency and the antiresonance frequency to vary considerably. Thus, it is possible to obtain an admittance curve where no spurious component is present between the resonance frequency and the antiresonance frequency.

These and other objects, features, aspects and advantages of the present invention will become more apparent from the following detailed description of the present invention when taken in conjunction with the accompanying drawings.

DESCRIPTION OF THE PREFERRED EMBODIMENTS

In the present invention, in order to realize a piezoelectric resonator resistant to spurious components, occurrence of the spurious components themselves is not prevented but an admittance frequency response is controlled such that the spurious components occur at a frequency other than frequencies in the range from resonance frequency fr of the piezoelectric resonator to antiresonance frequency fa. In order to carry out such control, the piezoelectric resonator of the present invention includes a spurious component control layer for controlling a frequency at which the spurious components occur, in addition to a basic structure consisting of a lower electrode, a piezoelectric body, and an upper electrode. Described below is a structure of the piezoelectric resonator according to the present invention additionally including the spurious component control layer.

First Embodiment

Figure 1A:
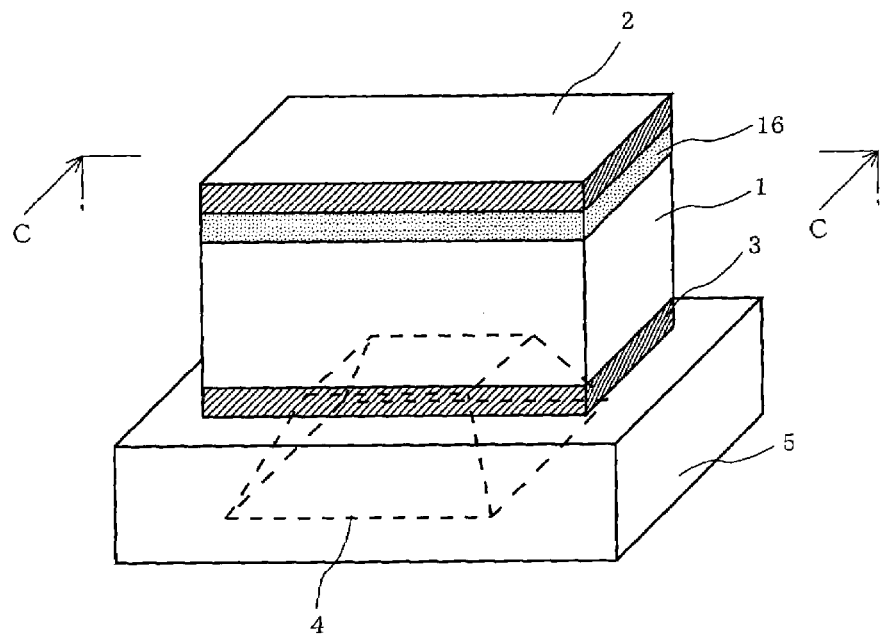
FIG. 1A is a perspective view of a piezoelectric resonator according to a first embodiment of the present invention.
Figure 1B:
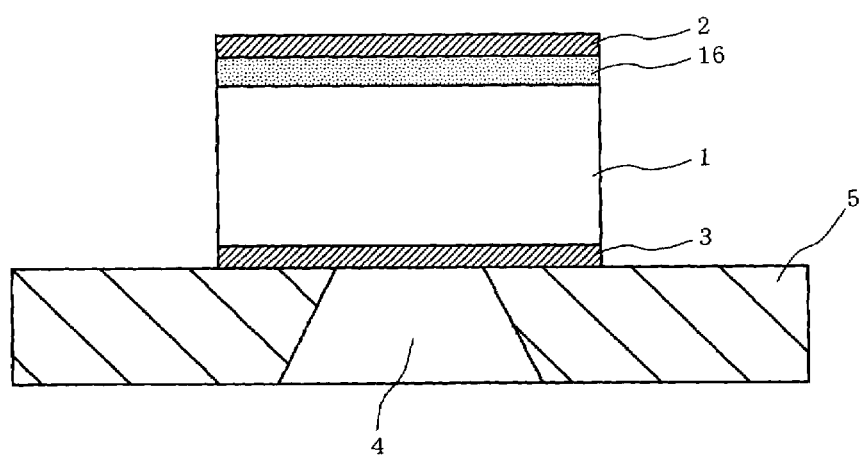
FIG. 1B is a view showing a structure pattern of the piezoelectric resonator shown in FIG. 1A.

FIG. 1A is a perspective view showing an exemplary structure pattern of a piezoelectric resonator according to a first embodiment of the present invention. FIG. 1B is a cross-sectional view taken along line C-C shown in FIG. 1A. In FIGS. 1A and 1B, the piezoelectric resonator according to the first embodiment is structured such that on a substrate 5 having a cavity 4 provided therein, a lower electrode 3, a piezoelectric body 1, a spurious component control layer 16, and an upper electrode 2 are formed in this order from bottom up. The upper electrode 2 and the lower electrode 3 are composed of, for example, molybdenum (Mo). The piezoelectric body 1 is composed of, for example, a piezoelectric material such as aluminum nitride (AlN). The spurious component control layer 16 is composed of a metallic material, a dielectric material, or a piezoelectric material (which is different from the material of the piezoelectric body 1 included in the piezoelectric resonator). For example, the spurious component control layer 16 is composed of silicon dioxide ($SiO_2$) or silicon nitride (SiN). Note that depending on the material, the spurious component control layer 16 can be used as an etching stopper in a production process of the piezoelectric resonator, thereby simplifying the production process. The cavity 4 is provided in the form of, for example, a truncated pyramid vertically penetrating through the substrate 5.

Next, before describing the piezoelectric resonator according to the first embodiment, the principle that a frequency at which the spurious components occur is changed by providing the spurious component control layer to the piezoelectric resonator is described.

In the case where the piezoelectric resonator includes an additional layer, i.e., the spurious component control layer, which is composed of, for example, a metallic material, a dielectric material, or a piezoelectric material (which is different from the material of the piezoelectric body 1 included in the piezoelectric resonator), variations in energy and frequency occur due to differences in elastic constant and density between the piezoelectric body and the additional layer.

Now, consider a case where a resonance frequency of a piezoelectric resonator including no spurious component control layer is fr1, a resonance frequency of a piezoelectric resonator including the spurious component control layer is fr2, a kinetic energy is K, and a potential energy is P. In this case, the relationship between a variation in resonance frequency and a variation in energy is represented by expression (1) below. Expression (1) can be derived based on variations in resonance frequency and energy obtained by Masons equivalent circuit. Note that in expression (1), energies denoted by primed symbols are energies generated in the spurious component control layer.

$$\frac{fr2 - fr1}{fr1} = \frac{\Delta f}{\Delta fr1} \cong \frac{1}{2}\left(\frac{P'}{P} - \frac{K'}{K}\right) \quad (1)$$

It is understood from expression (1), if the piezoelectric resonator is additionally provided with the spurious component control layer, it is possible to achieve effects as follows.

(A) If the spurious component control layer is formed in the vicinity of a maximum distortion point (anode in the vibration displacement distribution), an increase of the kinetic energy is ignorable, and the potential energy is increased, thereby increasing the resonance frequency.

$$\Delta f/fr1 \approx \Delta P/2P \quad (2)$$

(B) If the spurious component control layer is formed in the vicinity of a maximum vibration point (an antinode in the vibration displacement distribution), an increase of the potential energy is ignorable, and the kinetic energy is increased, thereby reducing the resonance frequency.

$$\Delta f/fr1 \approx -\Delta K/2K \quad (3)$$

Because of effects as described above, if the spurious component control layer is formed in a position in the vicinity of the maximum distortion point in the portion A and the maximum vibration point in the portion B, the resonance frequency is increased in the portion A which is a source of generating spurious components, while being decreased in the portion B which is a source of generating main resonance. Thus, it is possible to set the frequency of the spurious components so as to be distanced from the resonance frequency of the main resonance. Also, even if the spurious component control layer is formed in a position in the vicinity of the maximum vibration points both in the portion A and the portion B, there is a difference in variation of resonance frequencies due to a difference between distribution displacement distributions in the portions. Thus, it is possible to control a frequency at which the spurious components occur, depending on the position of the spurious component control layer included in the piezoelectric resonator. Accordingly, if the spurious component control layer is formed in an appropriate position, it is possible to realize a piezoelectric resonator having an admittance frequency response in which the spurious components do not occur between the resonance frequency fr and the antiresonance frequency fa.

Described next is how the above-described effects are specifically achieved by the piezoelectric resonator according to the first embodiment.

Figure 2A:
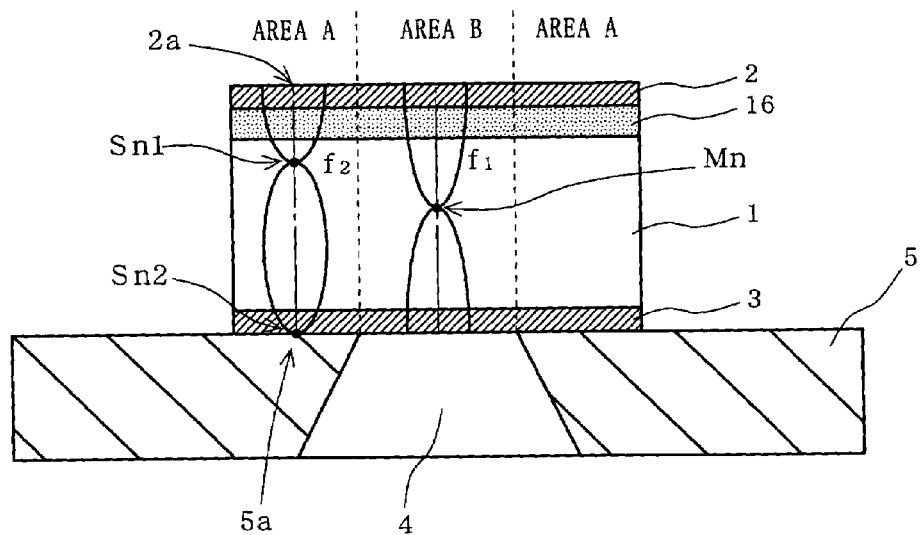
FIGS. 2A-2C are used for explaining an operation of the piezoelectric resonator shown in FIG. 1A.

Referring to FIG. 2A, sound speed in the piezoelectric body 1 and sound speed in the spurious component control layer 16 considerably differ from each other due to differences in elastic constant and density between the piezoelectric body 1 and the spurious component control layer 16. Also, a dielectric constant of the piezoelectric body 1 differs from a dielectric constant of the spurious component control layer 16. Further, there is a difference between the piezoelectric body 1 and the spurious component control layer 16 with respect to the presence or absence of a piezoelectric effect.

As described above, spurious components are generated because the piezoelectric resonator is supported by the substrate 5. The spurious vibration is generated due to vibration of a supporting portion (for example, a fixed end 5a) while a portion with two free ends above the cavity 4 is longitudinally vibrating in the thickness direction at the resonance frequency f1. As shown in FIG. 2A, if the piezoelectric resonator is divided into the portion A, in which the piezoelectric resonator is supported, and the portion B, in which the piezoelectric resonator is not supported, there is a considerable difference between vibration displacement distribution of the resonance frequency f2 in the portion A with one side fixed at the fixed end 5a and vibration displacement distribution of the resonance frequency f1 in the portion B with two free ends. The symbols Mn, Sn1, and Sn2 shown in FIG. 2A each indicate a portion as a node in the vibration displacement distribution. The node is a portion, which does not vibrate, and located at a maximum distortion point to which great distortion is applied.

The piezoelectric resonator according to the first embodiment is structured such that the spurious component control layer 16 is formed between the upper and lower electrodes 2 and 3 (specifically, between the upper electrode 2 and the piezoelectric body 1), and therefore greatly influences excitation of vibration. Now, consider an exemplary case where the thickness of the portion B corresponds to a ½ wavelength of vibration at the resonance frequency f1 and the thickness of the portion A corresponds to a ¾ wavelength of vibration at the resonance frequency f2. Comparing the resonance frequency f1 of the portion B and the resonance frequency f2 of the portion A, it is found that the resonance frequency f2 of the portion A is higher than the resonance frequency f1 of the portion B because the portion A has the fixed end 5a at an interface between the lower electrode 3 and the substrate 5 (FIG. 2A). Further, in comparison with the resonance frequency f1 of the portion B, the resonance frequency f2 of the portion A is more susceptible to influences of an elastic constant, a dielectric constant, and the presence or absence of a piezoelectric effect of the additionally provided spurious component control layer, because the portion A and the portion B differ from each other in the position of a vibration node. As a result, the vibration displacement distribution at the resonance frequency f2 varies greater than the vibration displacement distribution at the resonance frequency f1. Accordingly, in the case where the spurious component control layer 16 is additionally provided, the influence caused to the vibration of the portion B by a supporting portion (for example, the fixed end 5a) considerably varies as compared to a case where no spurious component control layer 16 is additionally provided. Because of the above-described effects, a variation of the spurious frequency due to addition of the spurious component control layer 16 is greater than a variation of the resonance frequency of a main resonance due to addition of the spurious component control layer 16.

In particular, the present invention achieves the above-described effects by additionally providing the spurious component control layer 16 with consideration of the vibration displacement distribution, such that spurious components, which are generated because the lower electrode 3 is supported by the substrate 5 in the portion A, occur at a frequency other than the resonance frequency fr and the antiresonance frequency fa. In the above example, although the resonance frequency f2 of the portion A corresponds to ¾ wavelength vibration, a resonance for achieving the effects of the present invention is not limited to ¾ wavelength resonance (f2) as described above. A piezoelectric resonator having an admittance response, in which no spurious component occurs between the resonance frequency fr and the antiresonance frequency fa, can be realized by additionally providing the spurious component control layer 16 with consideration of the difference in displacement distribution between the portion B, in which the lower electrode 3 is out of contact with the substrate 5, and the portion A, in which the lower electrode 3 (at the bottom) is in contact with the substrate 5.

Figure 2B:
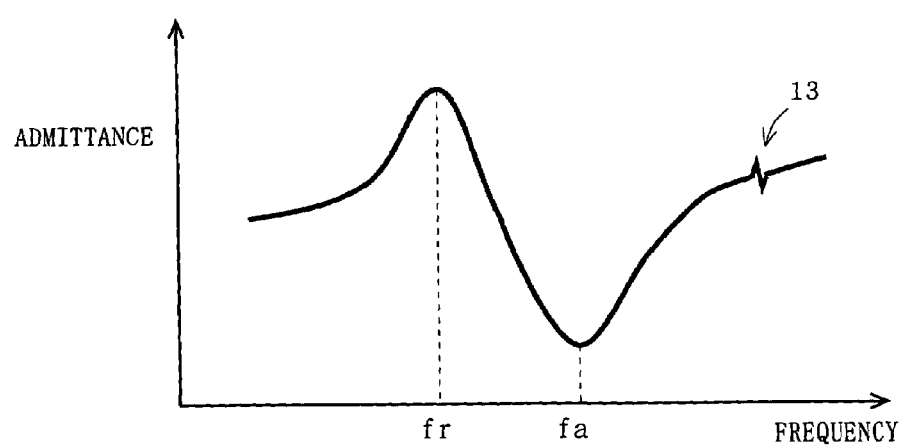
Figure 2C:
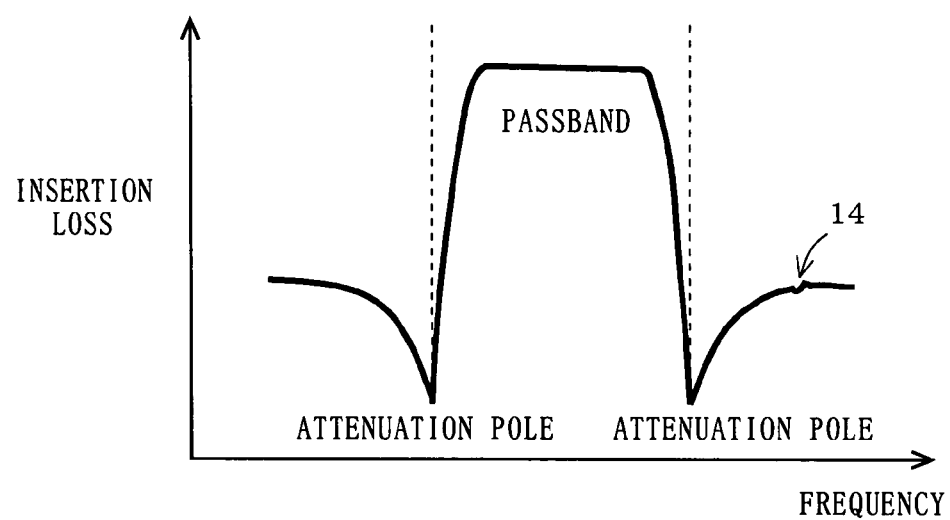

As such, in the first embodiment, it is possible to realize a piezoelectric resonator having an admittance frequency response (FIG. 2B), in which the spurious component 13 due to unwanted vibration does not occur between the resonance frequency fr and the antiresonance frequency fa, by suitably selecting thicknesses of the piezoelectric body 1 and the spurious component control layer 16. Also, by using such a piezoelectric resonator, it is possible to realize a filter having a smooth pass characteristics curve (FIG. 2C). Also, as described in the first embodiment, if the spurious component control layer 16 is formed between the piezoelectric body 1 and the upper electrode 2, it is possible to solve a conventional problem where adhesive strength between the piezoelectric body 1 and the upper electrode 2 is insufficient and unreliable. Thus, it is possible to increase the reliability of the piezoelectric resonator.

Note that the spurious component control layer to be additionally provided to the piezoelectric resonator is not limited to the first embodiment in terms of the number, position, type, thickness, etc., which can be freely set depending on desired purposes and effects (as will be described in the second embodiment) Although the first embodiment has been described with respect to a case where the spurious component control layer is formed such that the spurious frequency is equal to or more than the antiresonance frequency fa, the spurious component control layer may be formed such that the spurious frequency is less than the resonance frequency fr.

A temperature coefficient of the resonance frequency of the piezoelectric body 1 is generally considerable. Accordingly, if the spurious component control layer 16 is composed of, for example, $SiO_2$, it is possible to compensate for a temperature characteristic of the elastic constant of the piezoelectric body 1, thereby reducing a variation of the resonance frequency of the piezoelectric resonator with respect to temperature. As a result, it is possible to improve the temperature characteristic of the resonance frequency, thereby efficiently carrying out the temperature compensation.

Assuming that the thickness of the spurious component control layer 16 is t1 and the thickness of the piezoelectric body 1 is t2, it is preferred that the ratio t1/t2 between the thicknesses is less than or equal to ⅕. If the thickness of the spurious component control layer 16 is selected in this manner, it is possible to achieve an effect of controlling the spurious frequency without reducing the admittance frequency response.

Figure 3A:
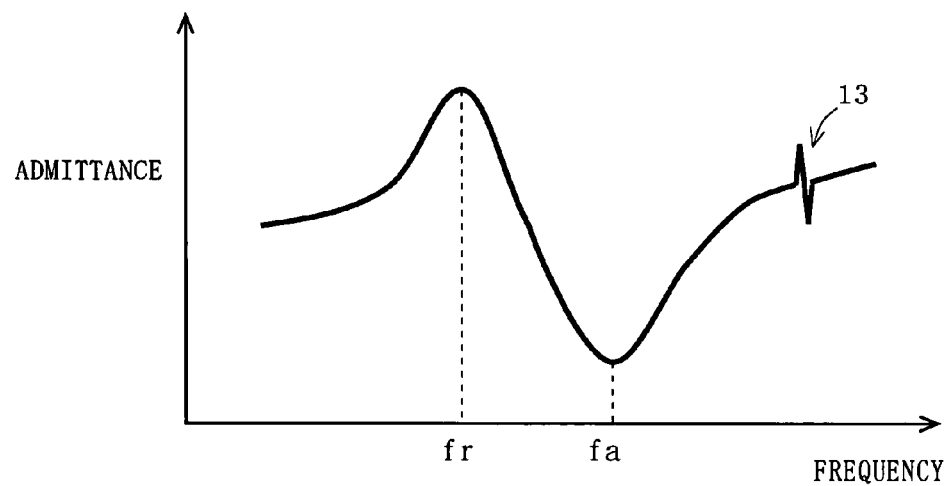
FIGS. 3A and 3B are graphs used for explaining the advantage in using a spurious component control layer having a small mechanical quality factor.
Figure 3B:
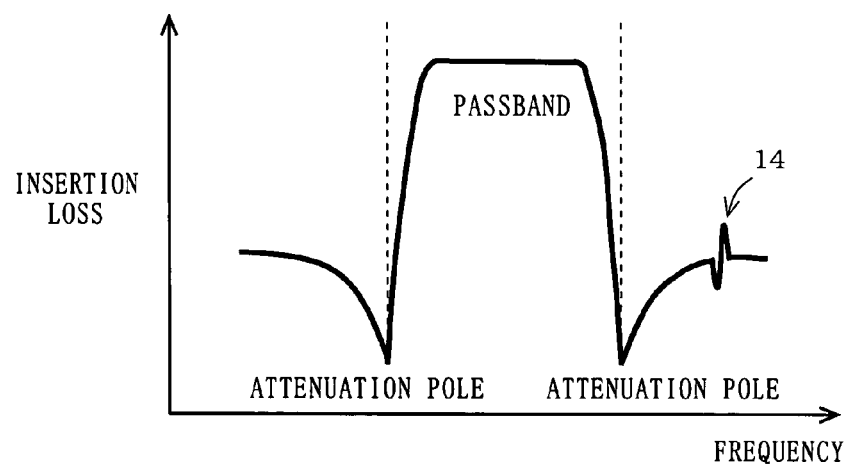

Basically, it is preferred that the spurious component control layer 16 is composed of a dielectric material having a mechanical quality factor higher than a mechanical quality factor of the material of the piezoelectric body 1. In such a case, if the piezoelectric resonator is used in a filter, the Q-value of the resonator is increased, making it possible to obtain steeper skirt characteristics. However, the Q-value of the spurious component 13 to be generated can be high depending on properties of the spurious component control layer (FIG. 3A), even if the spurious components are shifted out of the range between the resonance frequency fr and the antiresonance frequency fa. In such a case, even if the filter is configured using a piezoelectric resonator having a high Q-value, a portion 14 where the pass characteristics are deteriorated might occur outside the passband, making it difficult to ensure a desired amount of attenuation (FIG. 3B). In such a case, by selecting a material of the spurious component control layer so as to have a mechanical quality factor lower than that of the material of the piezoelectric body 1, it is made possible to suppressing vibration of the spurious component 13 itself (see FIG. 2C).

Second Embodiment

A second embodiment is described with respect to another structure pattern of the piezoelectric resonator described in the first embodiment. Note that the structure pattern described in the second embodiment is merely an example, and various other structure patterns are conceivable.

Figure 4A:
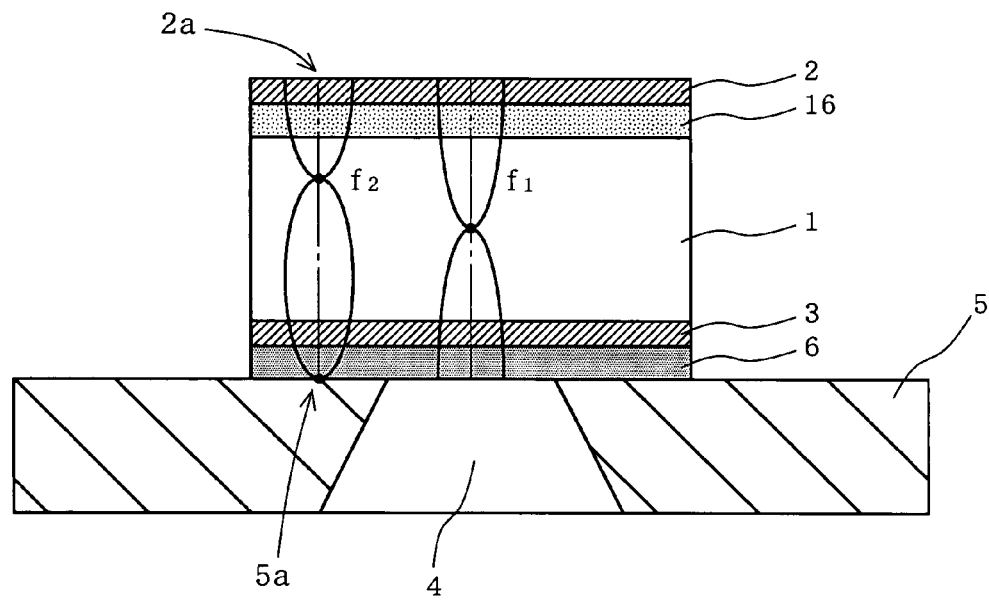
FIGS. 4A-4K are cross-sectional views showing various structure patterns of a piezoelectric resonator according to a second embodiment of the present invention.

(1) In one exemplary structure, a spurious component control layer 6 is provided between the lower electrode 3 and the substrate 5, and the spurious component control layer 16 is provided between the upper electrode 2 and the piezoelectric body 1 (FIG. 4A). With this structure, it is possible to increase adhesive strength between the piezoelectric resonator and the substrate 5, while maintaining an effect of preventing any spurious component from occurring between the resonance frequency fr and the antiresonance frequency fa, whereby it is possible to increase the reliability of the piezoelectric resonator. Note that the spurious component control layer 6 and the spurious component control layer 16 may or may not be composed of the same material.

Figure 4B:
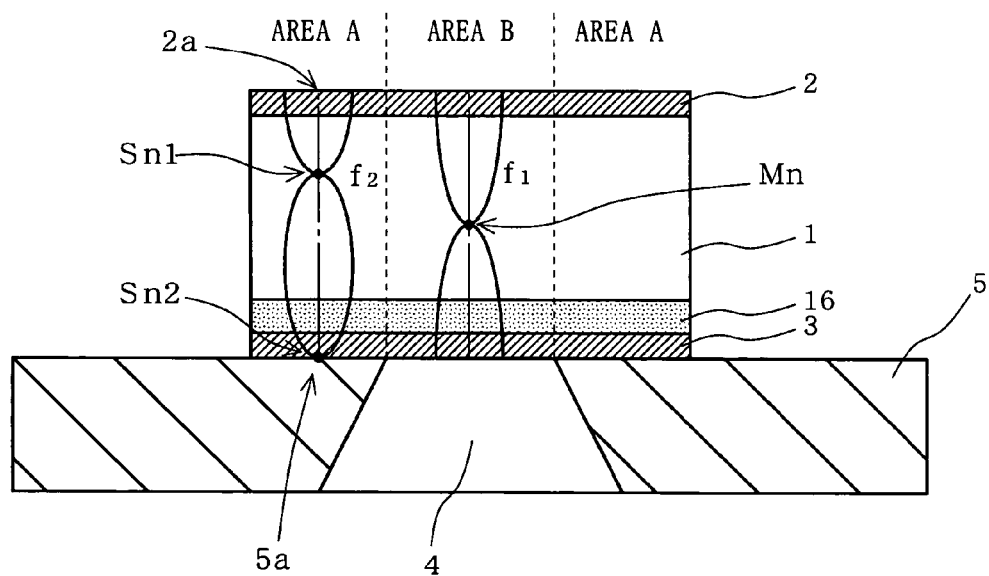

(2) In one exemplary structure, the spurious component control layer 16 is provided between the piezoelectric body 1 and the lower electrode 3 (FIG. 4B). With this structure, it is possible to make a distance between node Sn2 and the spurious component control layer 16 (FIG. 4B) shorter than a distance between node Sn1 and the spurious component control layer 16 (FIG. 2A) as compared to the case where the spurious component control layer 16 is provided between the piezoelectric body 1 and the upper electrode 2. Thus, the piezoelectric resonator having this structure achieves a great spurious frequency control effect as compared to the piezoelectric resonator according to the first embodiment. Also, by providing the spurious component control layer 16 between the piezoelectric body 1 and the lower electrode 3, it is possible to solve the conventional problem where the reliability is decreased due to unsatisfactory adhesive strength between the piezoelectric body 1 and the lower electrode 3, whereby it is possible to increase the reliability of the piezoelectric resonator.

Figure 4C:
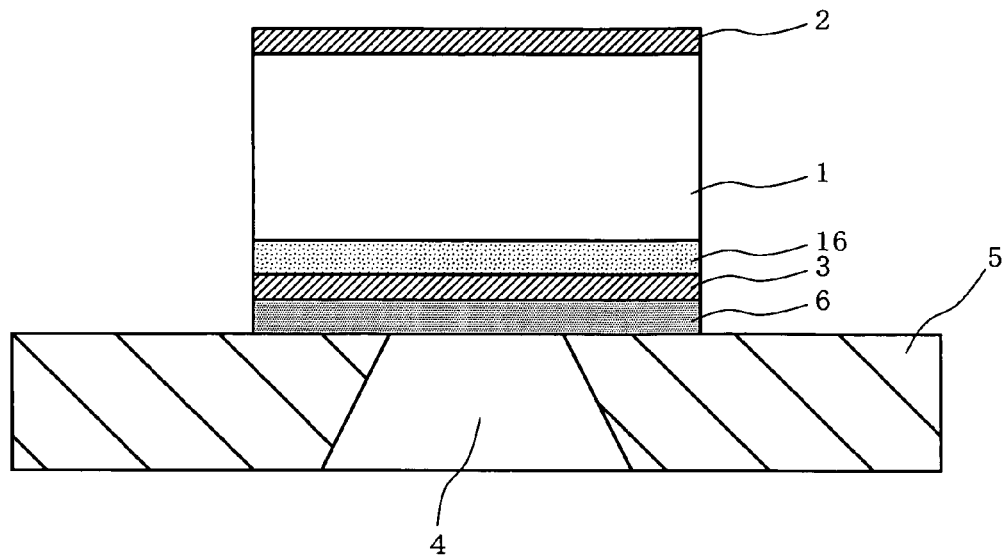

(3) In one exemplary structure, the spurious component control layer 6 is provided between the lower electrode 3 and the substrate 5, and the spurious component control layer 16 is provided between the piezoelectric body 1 and the lower electrode 3 (FIG. 4C). With this structure, it is possible to increase adhesive strength between the piezoelectric resonator and the substrate 5, while maintaining an effect of preventing any spurious component from occurring between the resonance frequency fr and the antiresonance frequency fa, whereby it is possible to increase the reliability of the piezoelectric resonator. Note that the spurious component control layer 6 and the spurious component control layer 16 may or may not be composed of the same material.

Figure 4D:
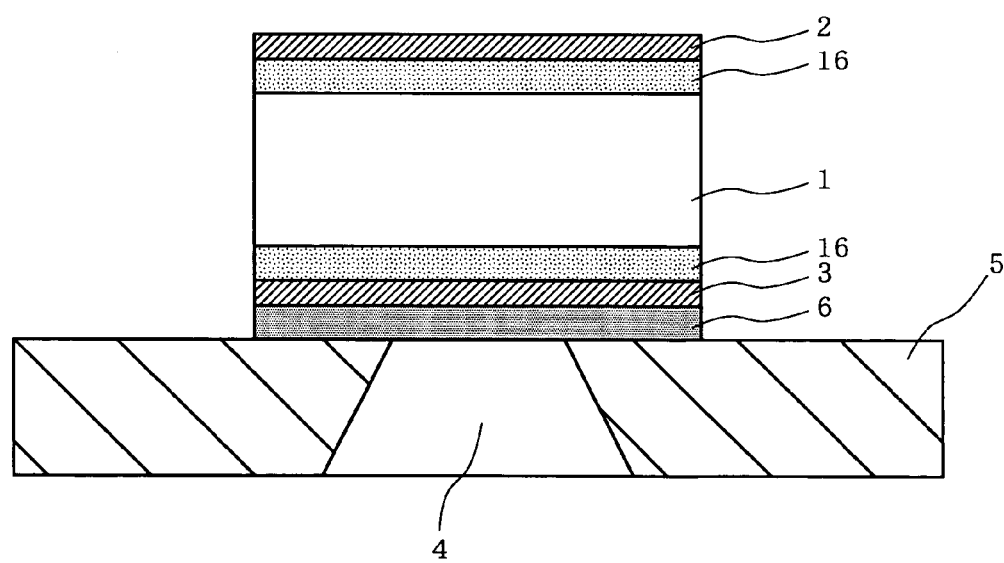

(4) In one exemplary structure, the spurious component control layer 6 is provided between the lower electrode 3 and the substrate 5, and the spurious component control layer 16 is provided between the upper electrode 2 and the piezoelectric body 1 and between the piezoelectric body 1 and the lower electrode 3 (FIG. 4D). In this structure, two spurious component control layers 16 provided above and below the piezoelectric body 1 considerably influences excitation of spurious components, thereby readily achieving an effect of preventing any spurious component from occurring between the resonance frequency fr and the antiresonance frequency fa. Note that the spurious component control layers 6 and the spurious component control layer 16 may or may not be composed of the same material. Particularly, in the case where the spurious component control layer 16 are composed of a piezoelectric material, only piezoelectric bodies are present between the upper electrode 2 and the lower electrode 3. Accordingly, it is possible to achieve an effect of controlling spurious frequencies without reducing the admittance frequency response. The spurious component control layers are composed of a metallic material having a high mechanical quality factor, and therefore it is possible to obtain a piezoelectric resonator having a high Q-value.

Figure 4E:
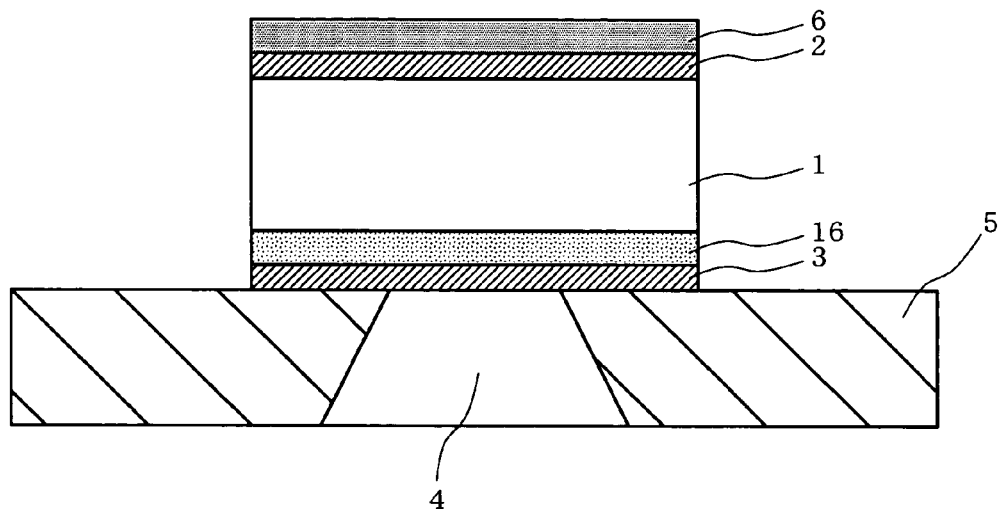

(5) In one exemplary structure, the spurious component control layer 6 is provided on top of the upper electrode 2, and the spurious component control layer 16 is provided between the piezoelectric body 1 and the lower electrode 3 (FIG. 4E). This structure is advantageous in that the top surface of the upper electrode 2 is protected by the spurious component control layer 6. Note that the spurious component control layer 6 and the spurious component control layer 16 may or may not be composed of the same material.

Figure 4F:
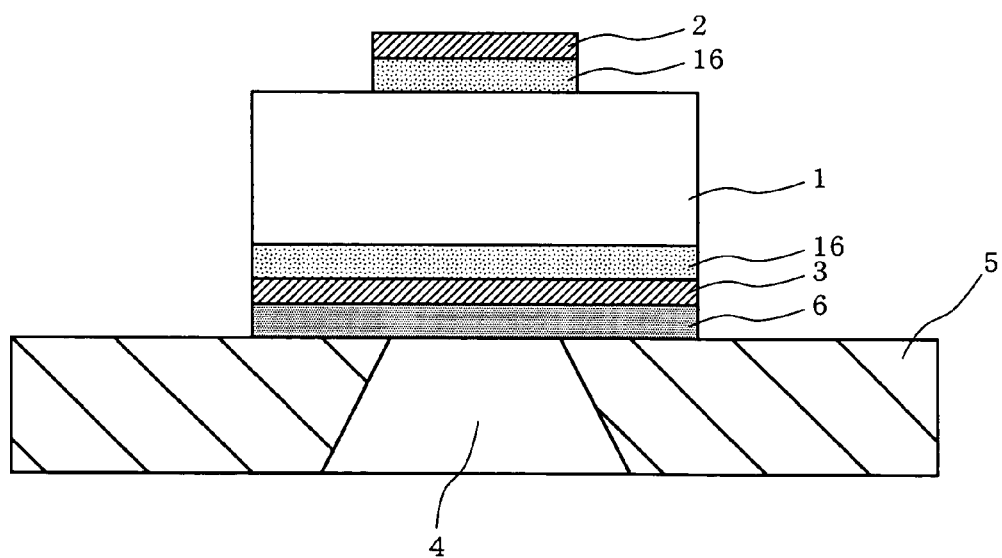

(6) In one exemplary structure, the upper electrode 2 and an upper spurious component control layer 16 are different in base area from the piezoelectric body 1, the lower electrode 3, the spurious component control layer 6, and a lower spurious component control layer 16 (FIG. 4F). In this structure, the piezoelectric body 1 is formed so as to extend outward beyond edges of the upper electrode 2 in a horizontal direction. Portions of the piezoelectric body 1, which lie beyond the edges in the horizontal direction, do not vibrate, and therefore the edges of the upper electrode 2 are restrained from freely vibrating, resulting in a further reduction of spurious components due to longitudinal vibration of portions of the substrate 5 where the piezoelectric resonator is supported. Also, the portions of the piezoelectric body 1, which lie beyond the edges in the horizontal direction, impedes reflection of vibration propagating in the horizontal direction, resulting in a reduction of spurious components due to the vibration propagating in the horizontal direction. Note that a spurious frequency control effect achieved by the piezoelectric resonator shown in FIG. 4F is similar to that achieved by the piezoelectric resonator shown in FIG. 4D.

Figure 4G:
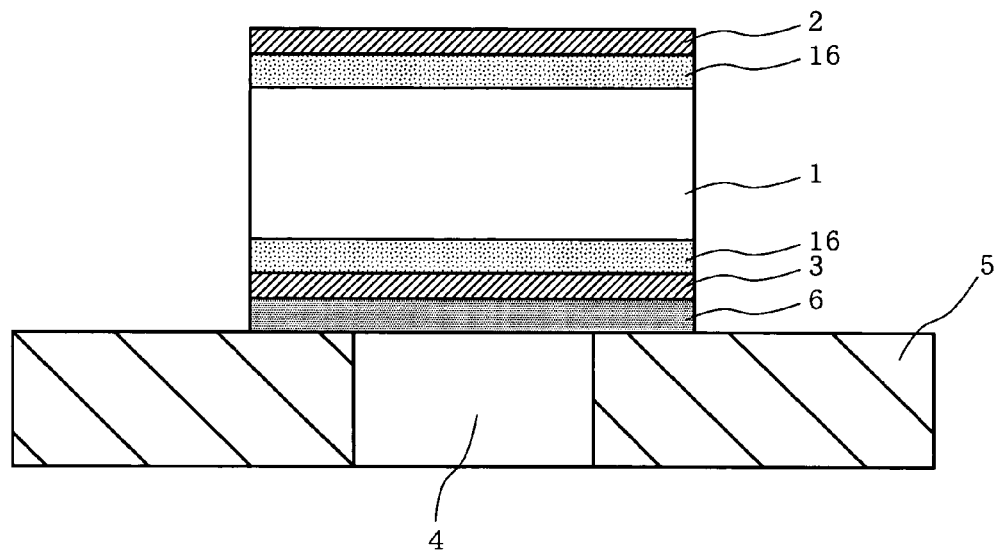
Figure 4H:
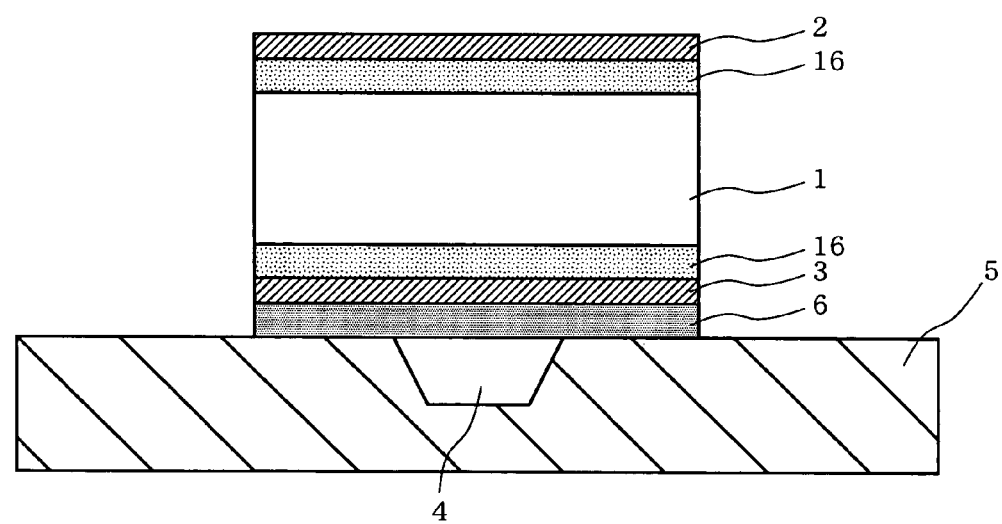

(7) In one exemplary structure, the cavity 4 is provided in a form other than a truncated pyramid (FIGS. 4G and 4H). In this structure, the cavity 4 may be provided in the substrate 5 so as to have a rectangular cross section (FIG. 4G). Although the foregoing has described that the cavity 4 vertically penetrates through the substrate 5, the cavity 4 may be formed in the top surface of the substrate 5 so as not to penetrate through the substrate 5 (FIG. 4H). Even the thus-formed cavity ensures free vibration of the piezoelectric resonator.

Figure 4I:
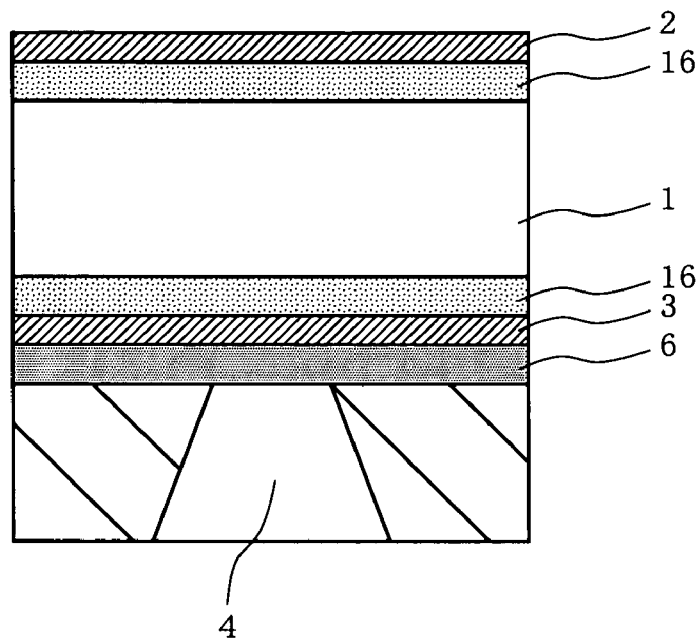
Figure 4J:
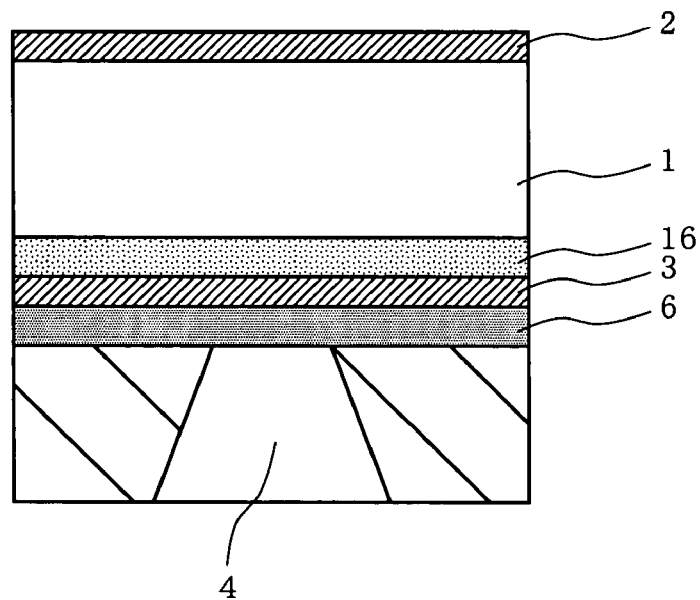
Figure 4K:
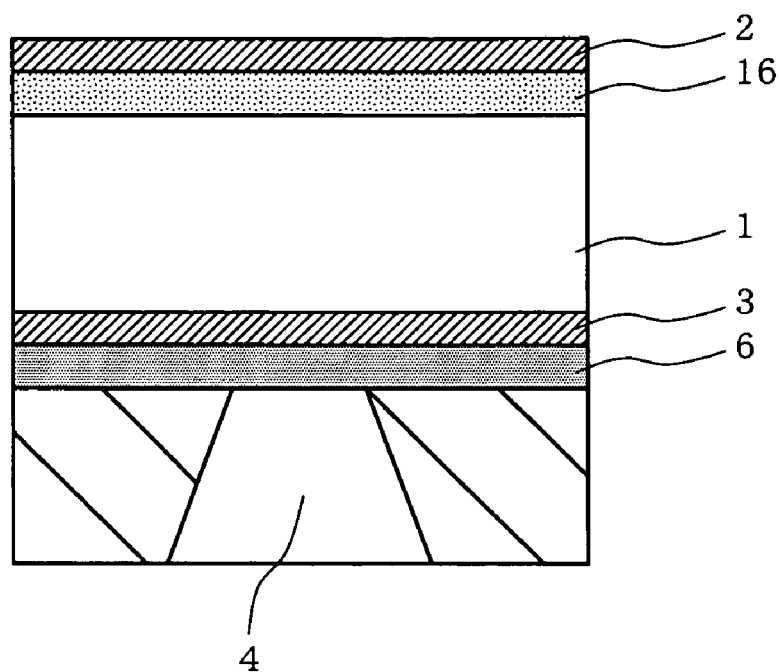

(8) In one exemplary structure, the piezoelectric body 1, the upper electrode 2, the lower electrode 3, and the spurious component control layers 6 and 16 are equal in base area to the substrate 5 (FIGS. 4I-4K). In FIGS. 4A-4H, the piezoelectric body 1, the upper electrode 2, the lower electrode 3, and the spurious component control layers 6 and 16 are different in base area from the substrate 5. However, effects as described above can be achieved even if the piezoelectric body 1, the upper electrode 2, the lower electrode 3, and the spurious component control layers 6 and 16 are equal in base area to the substrate 5.

Note that in the piezoelectric resonator having a structure in which the spurious component control layer 16 is provided between the piezoelectric body 1 and the lower electrode 3, it is possible to control not only spurious components caused due to longitudinal vibration but also spurious components caused due to lateral vibration.

Third Embodiment

Figure 5A:
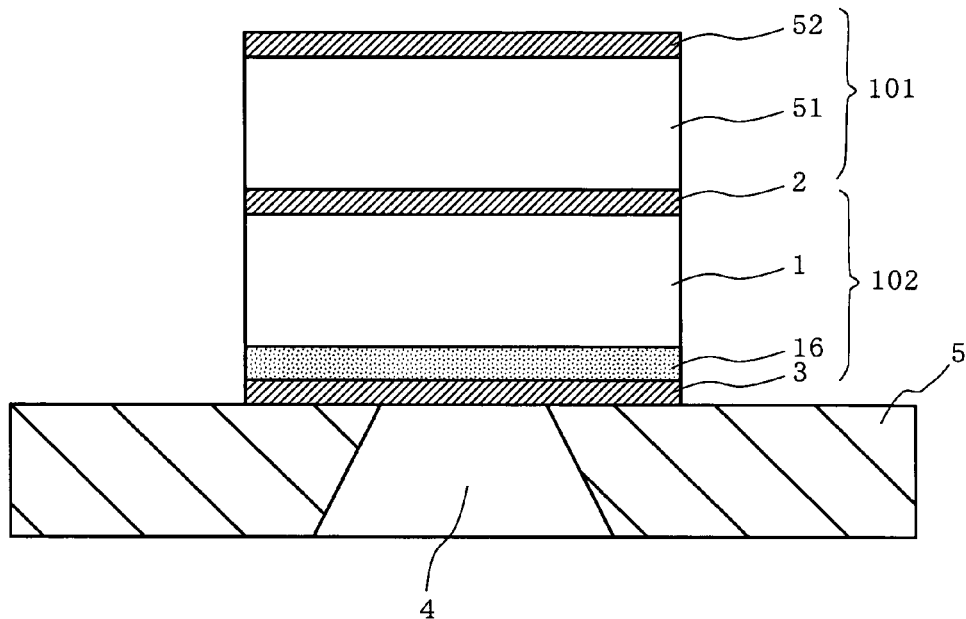
FIGS. 5A-5E are cross-sectional views showing various structure patterns of a piezoelectric resonator according to a third embodiment of the present invention.
Figure 5B:
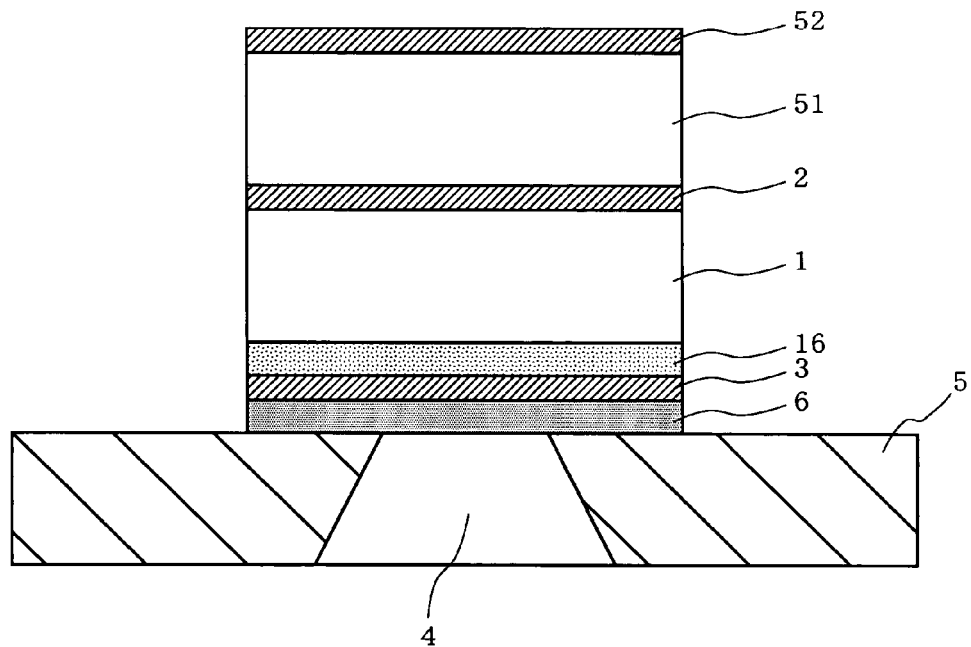
Figure 5C:
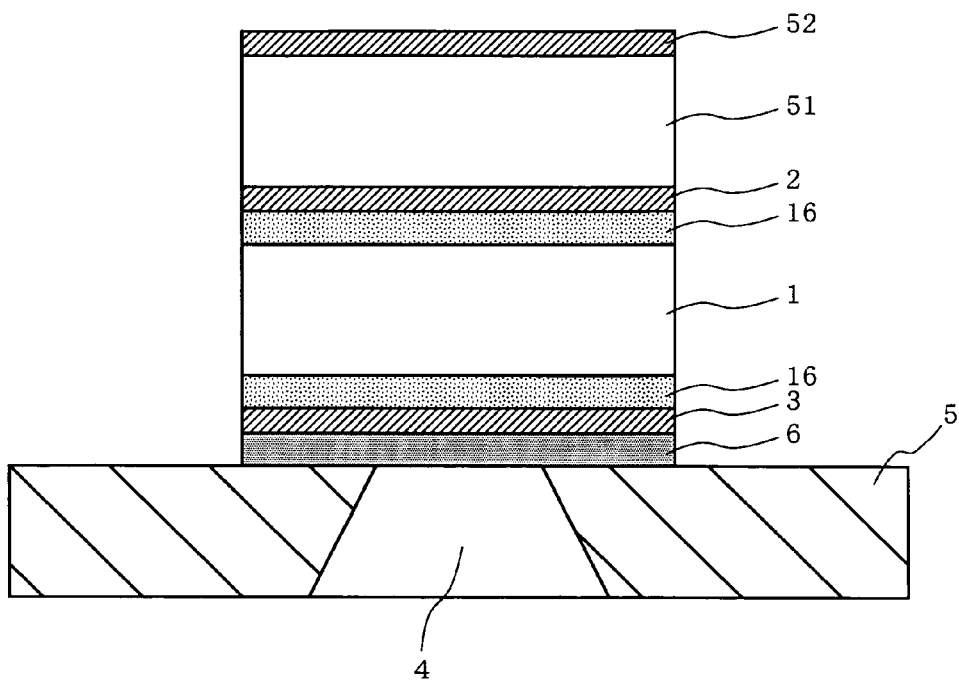
Figure 5D:
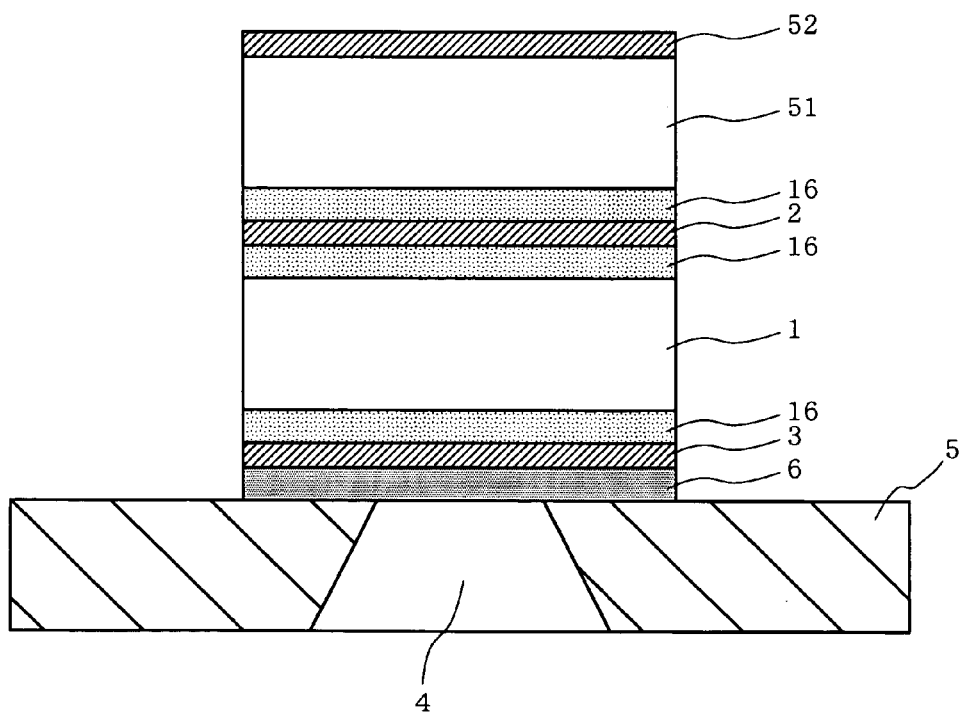
Figure 5E:
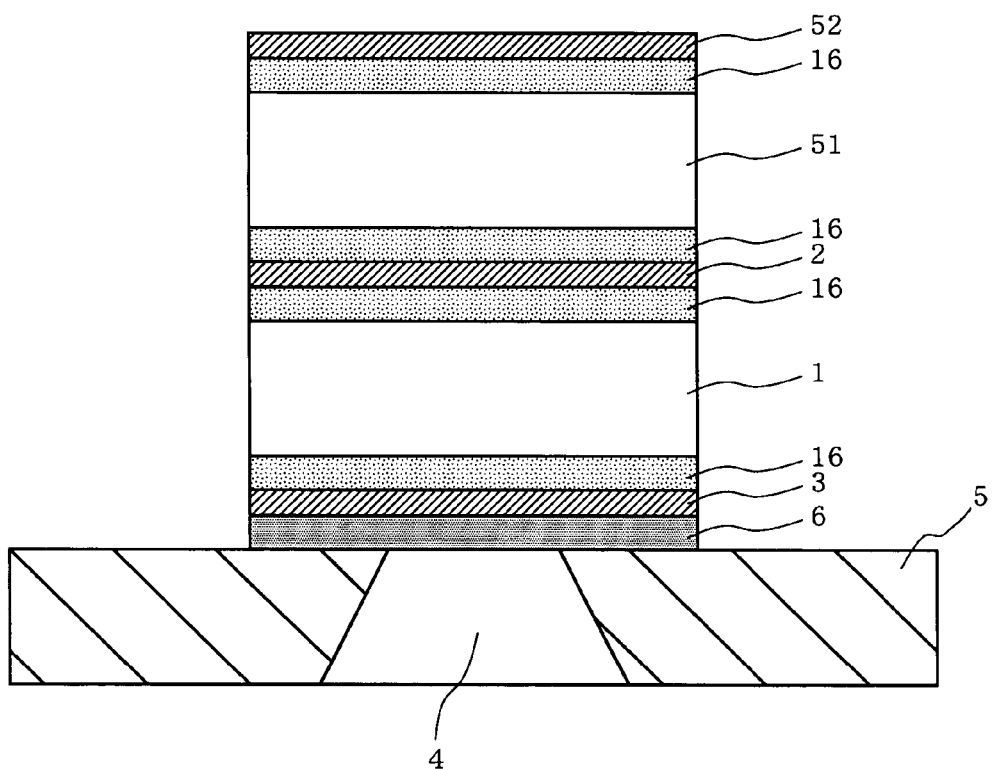

FIG. 5A is a cross-sectional view showing an exemplary structure pattern of a piezoelectric resonator according to a third embodiment of the present invention. In FIG. 5A, the piezoelectric resonator according to the third embodiment is structured such that on the substrate 5 having the cavity 4 provided therein, the lower electrode 3, the spurious component control layer 16, the piezoelectric body 1, the upper electrode 2, an additional piezoelectric body 51, and an additional electrode 52 are formed in this order from bottom up. The upper electrode 2, the lower electrode 3, and the additional electrode 52 are composed of, for example, molybdenum (Mo). The piezoelectric body 1 and the additional piezoelectric body 51 are composed of, for example, a piezoelectric material such as aluminum nitride (AlN). The spurious component control layer 16 is composed of a metallic material, a dielectric material, or a piezoelectric material (which is different from the material of the piezoelectric body 1 included in the piezoelectric resonator). For example, the spurious component control layer 16 is composed of silicon dioxide ($SiO_2$) or silicon nitride (SiN). Note that depending on the material, the spurious component control layer 16 can be used as an etching stopper in a production process of the piezoelectric resonator, thereby simplifying the production process. The cavity 4 is provided in the form of, for example, a truncated pyramid vertically penetrating through the substrate 5.

In the piezoelectric resonator according to the third embodiment, the additional electrode 52, the additional piezoelectric body 51, and the upper electrode 2 form a first vibration portion 101. Also, the upper electrode 2, the piezoelectric body 1, the spurious component control layer 16, and the lower electrode 3 form a second vibration portion 102. In this structure, electrical energy applied between the additional electrode 52 and the upper electrode 2 is converted into mechanical energy by the first vibration portion 101, and then transmitted to the second vibration portion 102. In the second vibration portion 102, the transmitted mechanical energy is converted back into electrical energy, and released from the upper electrode 2 and the lower electrode 3. Also, in this structure, by providing the spurious component control layer 16 as in the first embodiment, it is made possible to cause variation of the spurious frequency to become greater than variation in resonance frequency of the main resonance of the piezoelectric resonator.

Thus, it is possible to prevent any spurious component due to influences by a fixed portion from occurring between the resonance frequency fr and the antiresonance frequency fa. Accordingly, it is possible to obtain an admittance curve where no spurious component is present between the resonance frequency fr and the antiresonance frequency fa. By using a filter with such a piezoelectric resonator, it is possible to obtain a smooth pass characteristics curve. Note that FIGS. 5B-5E are views showing other exemplary structure patterns of the piezoelectric resonator according to the third embodiment.

Fourth Embodiment

Figure 6A:
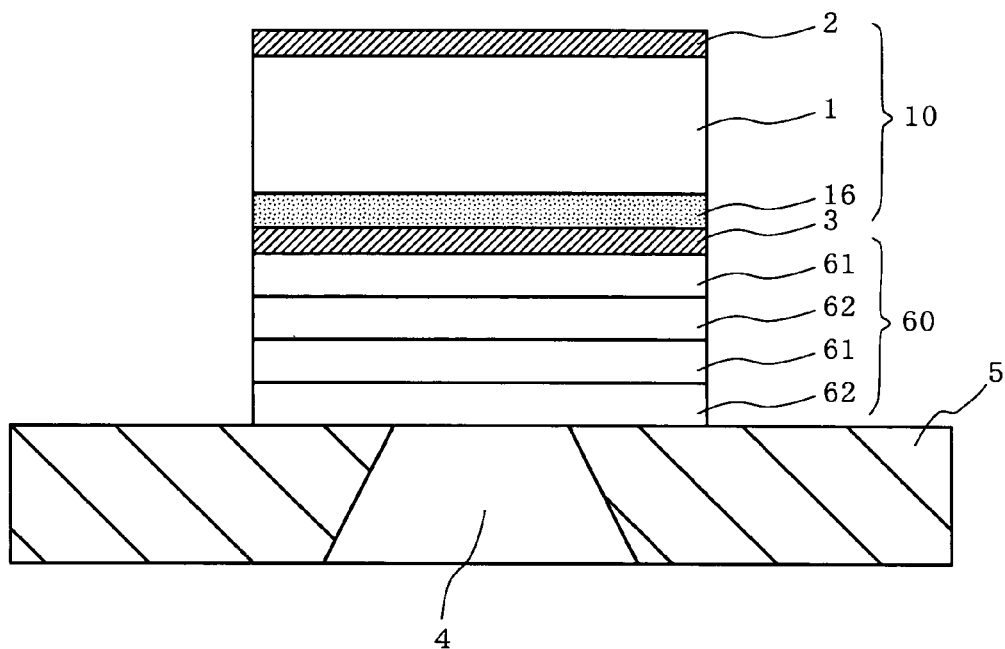
FIGS. 6A-6D are cross-sectional views showing various structure patterns of a piezoelectric resonator according to a fourth embodiment of the present invention.

FIG. 6A is a cross-sectional view showing an exemplary structure pattern of a piezoelectric resonator according to a fourth embodiment of the present invention. In FIG. 6A, the piezoelectric resonator according to the fourth embodiment is structured such that on the substrate 5, an acoustic mirror 60, the lower electrode 3, the spurious component control layer 16, the piezoelectric body 1, and the upper electrode 2 are formed in this order from bottom up. The upper electrode 2 and the lower electrode 3 are composed of, for example, molybdenum (Mo). The piezoelectric body 1 is composed of, for example, a piezoelectric material such as aluminum nitride (AlN). The spurious component control layer 16 is composed of a metallic material, a dielectric material, or a piezoelectric material (which is different from the material of the piezoelectric body 1 included in the piezoelectric resonator). For example, the spurious component control layer 16 is composed of silicon dioxide ($SiO_2$) or silicon nitride (SiN). Note that depending on the material, the spurious component control layer 16 can be used as an etching stopper in a production process of the piezoelectric resonator, thereby simplifying the production process.

The acoustic mirror 60 plays a role similar to that of the cavity 4, and is operable to trap resonant vibration of a vibration portion 10 with in the vibration portion 10. The acoustic mirror 60 is structured by laminating at least two types of layers each having an acoustic impedance different from that of the other layer. In this example, a low acoustic impedance layer 61 and a high acoustic impedance layer 62 alternate with each other. Each of the low acoustic impedance layer 61 and the high acoustic impedance layer 62 has a thickness equal to ¼ of a corresponding wavelength. The low acoustic impedance layer 61 is situated below the lower electrode 3. In this structure, it is possible to allow the piezoelectric resonator to resonate in a $\lambda/2$ mode. Also, in this structure, by providing the spurious component control layer 16 as in the first embodiment, it is made possible to cause variation of the spurious frequency to become greater than variation in resonance frequency of the main resonance of the piezoelectric resonator.

Figure 6B:
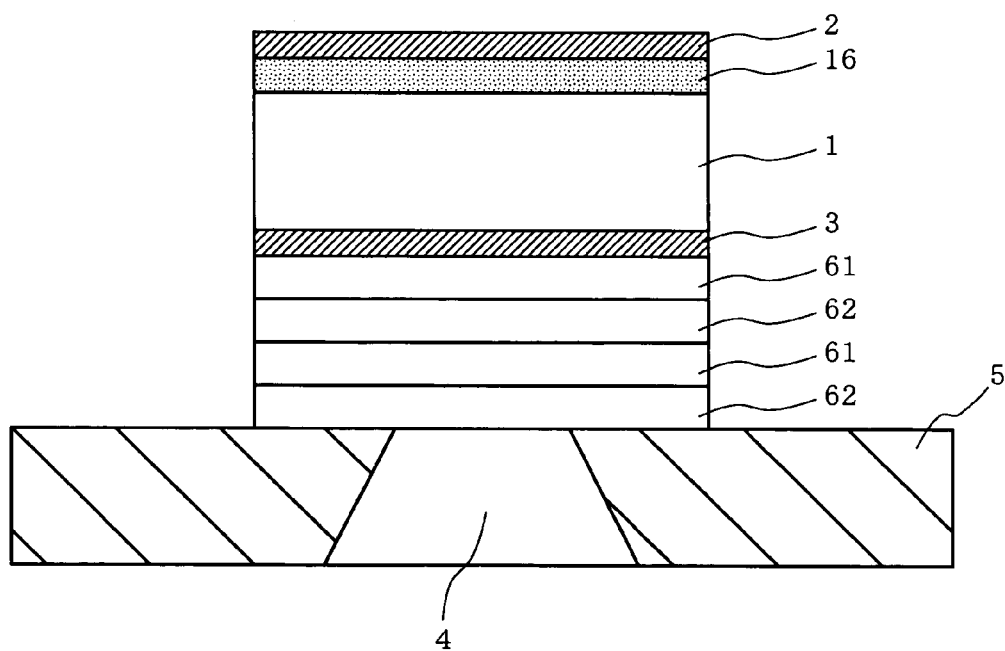
Figure 6C:
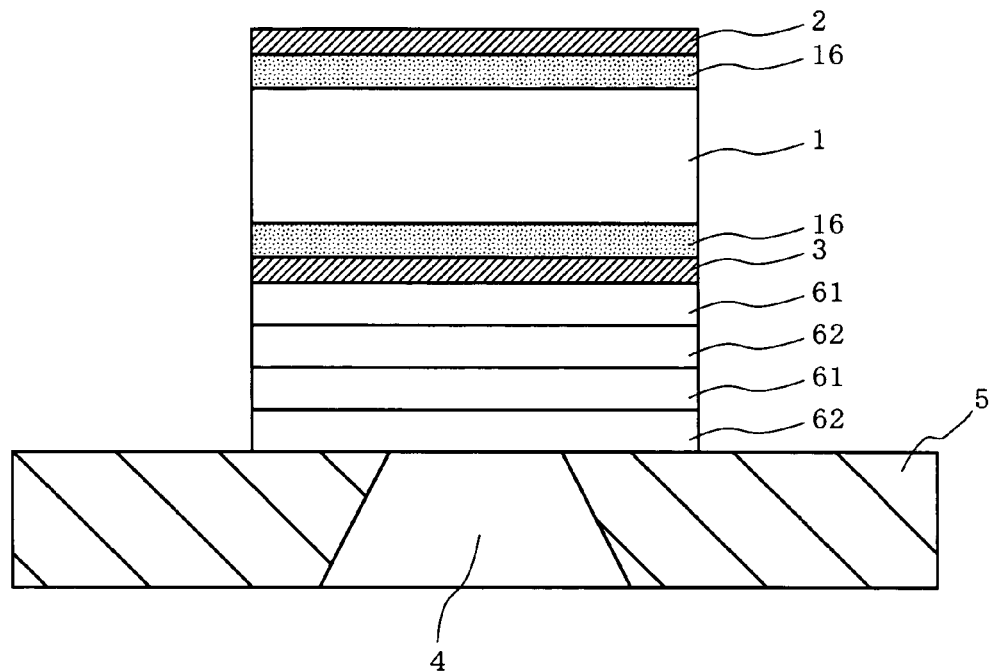
Figure 6D:
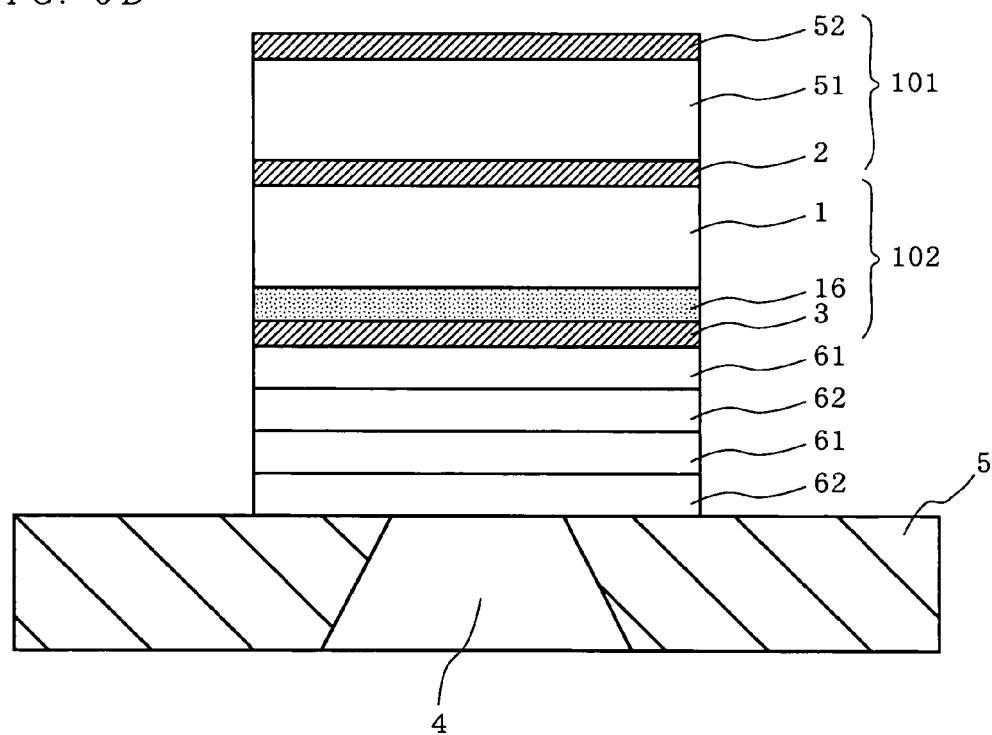

Thus, it is possible to prevent any spurious component due to influences by a fixed portion from occurring between the resonance frequency fr and the antiresonance frequency fa. Accordingly, it is possible to obtain an admittance curve where no spurious component is present between the resonance frequency fr and the antiresonance frequency fa. By using a filter with such a piezoelectric resonator, it is possible to obtain a smooth pass characteristics curve. Note that FIGS. 6B-6D are views showing other exemplary structure patterns of the piezoelectric resonator according to the fourth embodiment.

Note that it is preferred that the spurious component control layer used in the fourth embodiment is composed of a material having a low acoustic impedance in directions other than the thickness direction as compared to acoustic impedances of the piezoelectric body 1, the upper electrode 2, and the lower electrode 3. A difference in acoustic impedance between the thickness direction and another direction (e.g., a radial direction) is used to prevent any spurious vibration due to a transverse effect from occurring between the resonance frequency and the antiresonance frequency. For other types of vibration, a similar effect can be achieved by using a difference in acoustic impedance. Although the fourth embodiment has been described with respect to an exemplary piezoelectric resonator which resonates in the $\lambda/2$ mode, an effect similar to that achieved by such a piezoelectric resonator can be achieved by a piezoelectric resonator which resonates in a $\lambda/4$ mode.

Fifth Embodiment

Figure 7A:
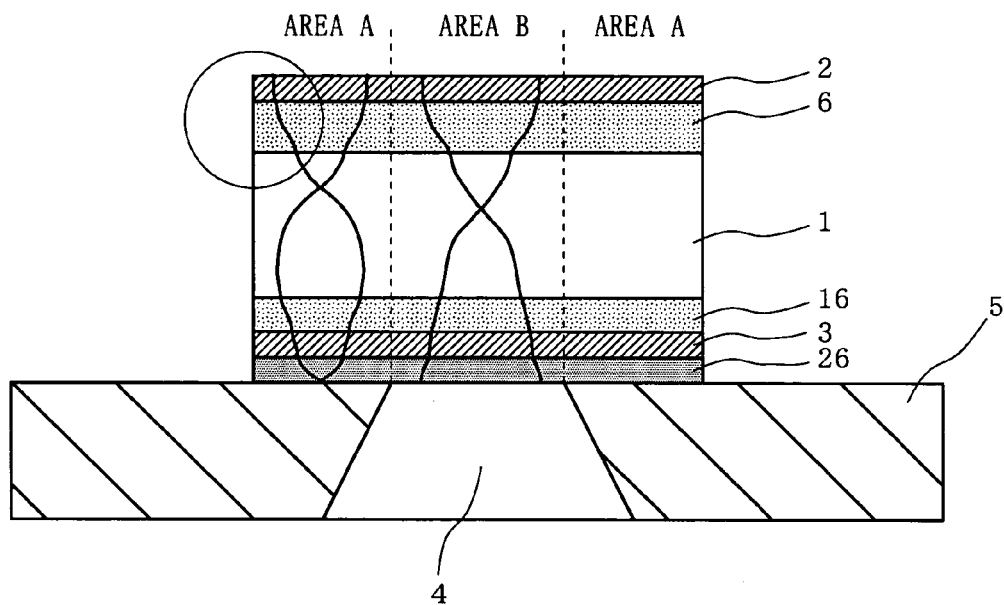
FIGS. 7A and 7B are views showing various structure patterns of a piezoelectric resonator according to a fifth embodiment of the present invention.
Figure 7B:
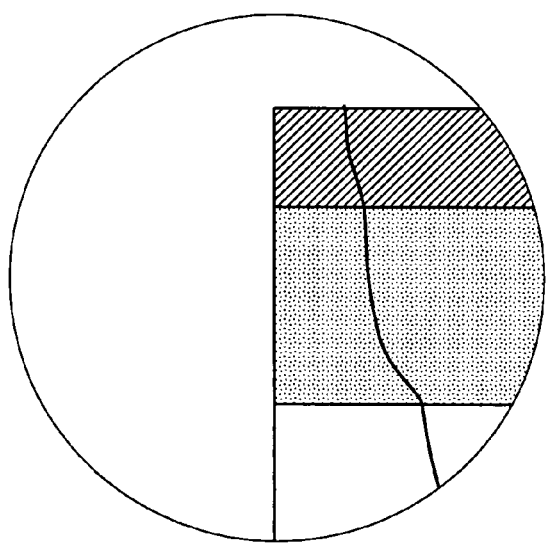

Described in a fifth embodiment is an effective structure of the piezoelectric resonator according to the second embodiment shown in FIG. 4D. FIG. 7A is a cross-sectional view showing an exemplary structure pattern of the piezoelectric resonator according to the fifth embodiment of the present invention. FIG. 7B is an enlarged view of a circled portion shown in FIG. 7A. In FIG. 7A, the piezoelectric resonator according to the fifth embodiment is structured such that three spurious component control layers 6, 16, and 26 are different in thickness from each other. Due to differences in thickness, vibration displacement distribution varies as shown in FIG. 7B. This is because sound speed differs among the upper electrode 2, the piezoelectric body 1, and the spurious component control layer 6, causing a gradient in the displacement distribution to become different for each material. Note that in this example, the spurious component control layers 6, 16, and 26 are composed of a material having an elastic constant (Young's modulus) smaller than that of the piezoelectric body 1. Thus, it is possible to prevent, based on the displacement distribution, any spurious component due to influences by a fixed portion from occurring between the resonance frequency fr and the antiresonance frequency fa.

Here, the spurious component control layers 6, 16, and 26 can be composed of a metallic material, a dielectric material, or a piezoelectric material (which is different from the material of the piezoelectric body 1 included in the piezoelectric resonator). In the case where the spurious component control layers 6, 16, and 26 are composed of a material different inelastic constant and density (additionally, dielectric constant and/or piezoelectric effect) from a material of a vibration portion, it is possible to prevent, based on differences in elastic constant and density (additionally, dielectric constant and/or piezoelectric effect) between the materials, any spurious component due to influences by a fixed portion from occurring between the resonance frequency fr and the antiresonance frequency fa.

Note that the spurious component control layers 6, 16, and 26 may be different from each other in terms of material. In such a case, a greater effect can be achieved by selecting thicknesses and materials of the spurious component control layer 6, 16, and 26, such that the position of a vibration node in the portion A and the position of a vibration antinode in the portion B are closer to each other.

(An Exemplary Filter including Piezoelectric Resonators)

Figure 8A:
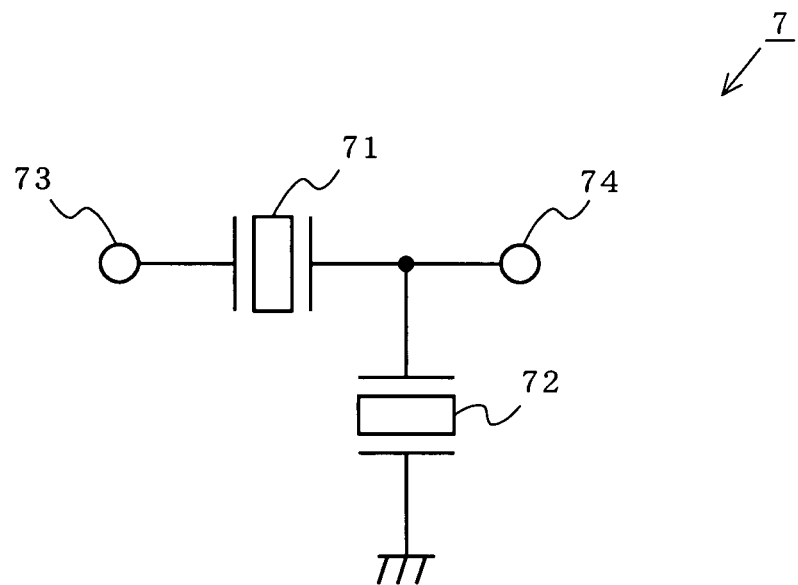
FIGS. 8A and 8B are diagrams each showing an exemplary filter including piezoelectric resonators of the present invention.

FIG. 8A is a diagram showing an exemplary filter 7 including piezoelectric resonators of the present invention. The filter 7 shown in FIG. 8A is a single stage ladder filter in which the piezoelectric resonators are connected so as to form an L shape. A first piezoelectric resonator 71 is connected so as to operate as a series resonator. Specifically, the first piezoelectric resonator 71 is connected in series between an input terminal 73 and an output terminal 74. A second piezoelectric resonator 72 is connected so as to operate as a parallel resonator. Specifically, the second piezoelectric resonator 72 is connected between a ground plane and a path from the input terminal 73 to the output terminal 74. The first piezoelectric resonator 71 and the second piezoelectric resonator 72 are optimally controlled in terms of spurious frequency, and therefore it is possible to realize the filter 7 so as to have a satisfactory frequency response.

Note that although the foregoing has described an exemplary L-shaped ladder filter, an effect similar to that achieved by the L-shaped ladder filter can be achieved by, for example, a T- or π-shaped ladder filter or a lattice-ladder filter. Also, the ladder filter may be a multiple stage filter as shown in FIG. 8B or may be a lattice-filter.

(An Exemplary Duplexer including Piezoelectric Resonators)

Figure 8B:
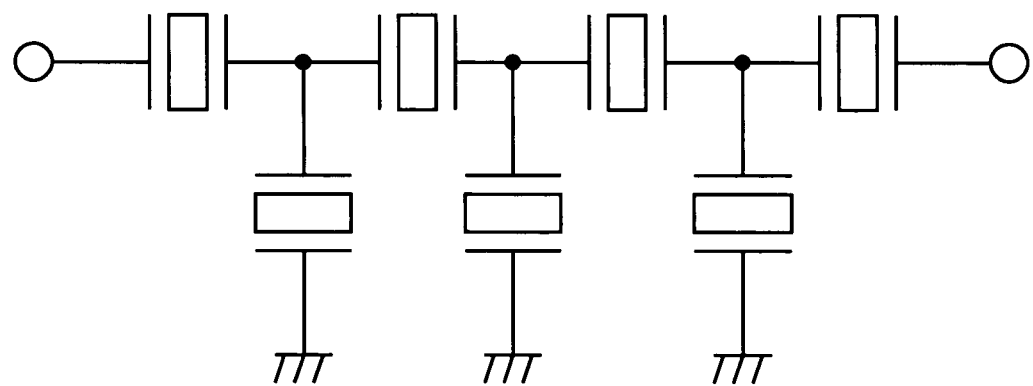
Figure 9:
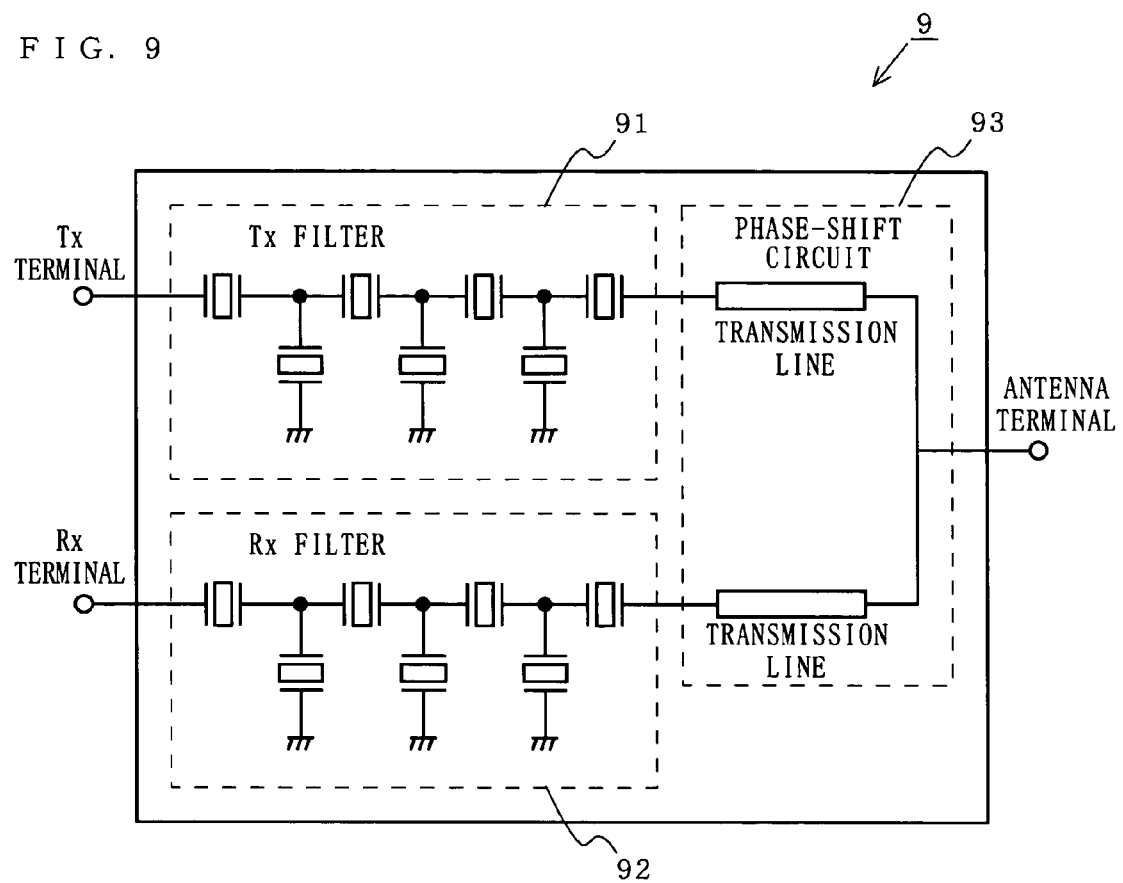
FIG. 9 is a diagram showing an exemplary duplexer including piezoelectric resonators of the present invention.
Figure 10A:
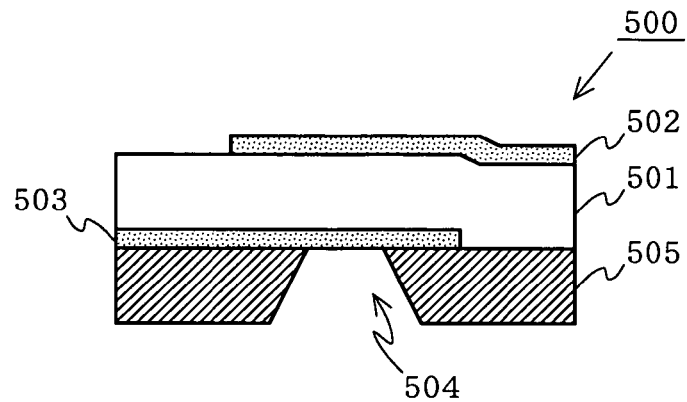
FIGS. 10A-10D are used for explaining a conventional piezoelectric resonator.
Figure 10B:
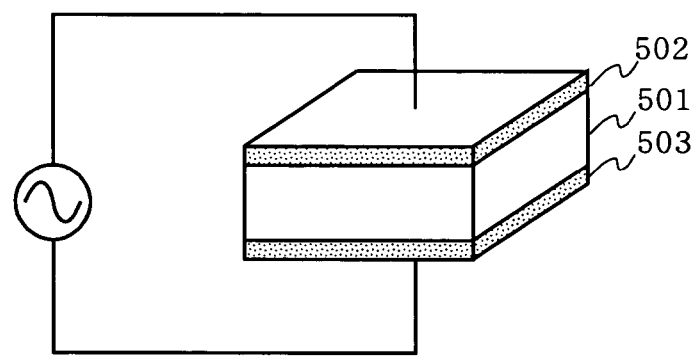
Figure 10C:
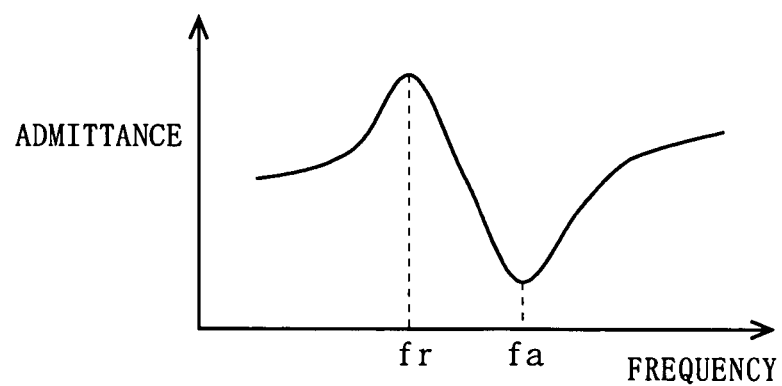
Figure 10D:
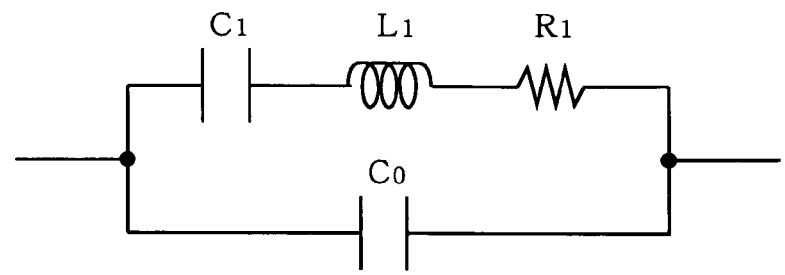
Figure 11:
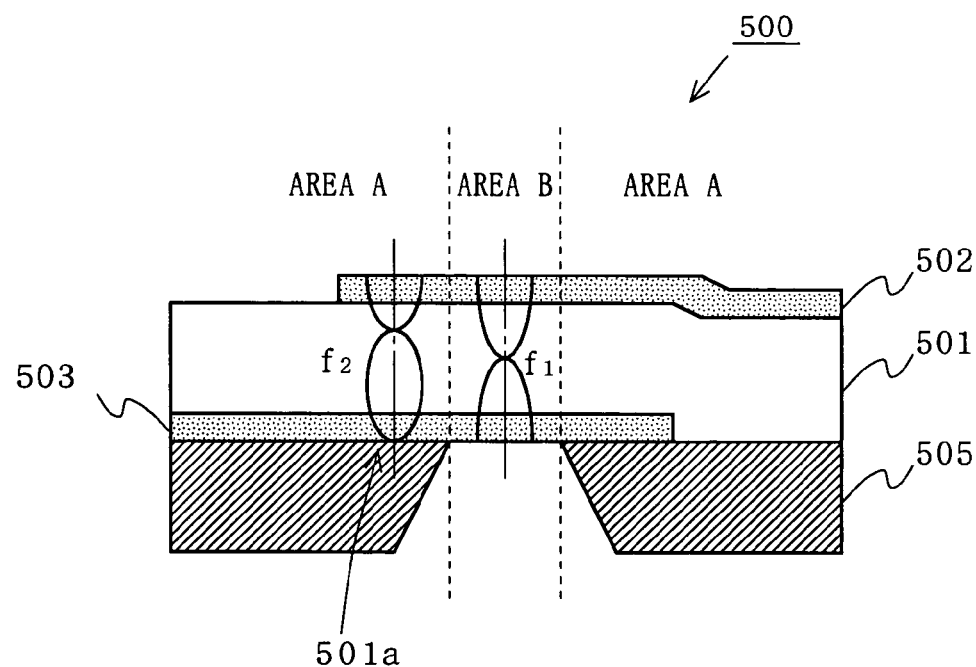
FIG. 11 and FIGS. 12A-12C are used for explaining a problem caused to a conventional piezoelectric resonator.
Figure 12A:
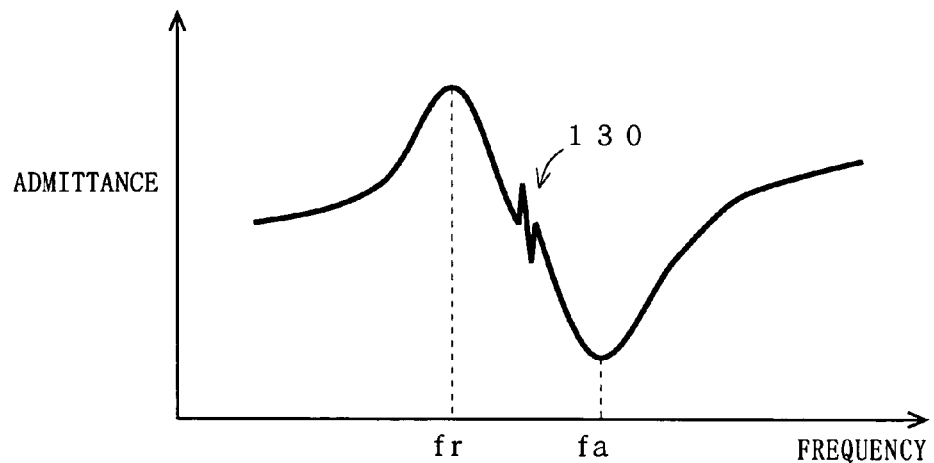
Figure 12B:
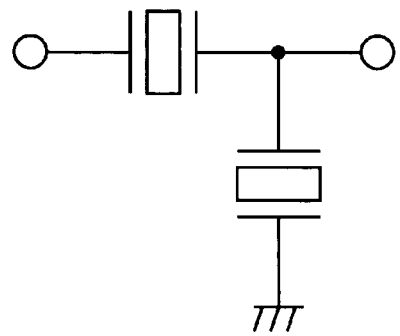
Figure 12C:
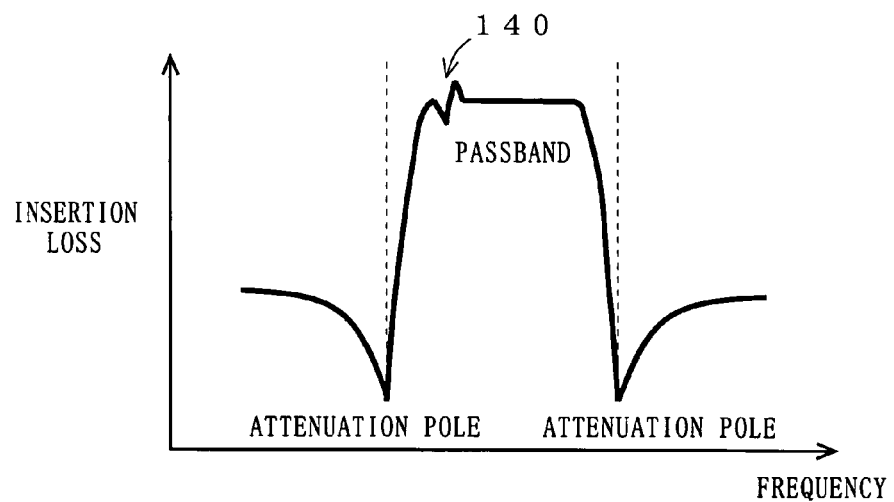

FIG. 9 shows a duplexer 9 including the multi stage ladder filter shown in FIG. 8B. The duplexer 9 includes: a Tx filter (a transmission filter) 91 consisting of a plurality of piezoelectric resonators; an Rx filter (a reception filter) 92 consisting of a plurality of piezoelectric resonators; and a phase-shift circuit 93 consisting of two transmission lines. The Tx filter 91 and the Rx filter 92 include the piezoelectric resonators which are optimally controlled in terms of spurious frequency, and therefore it is possible to realize the duplexer 9 so as to have a satisfactory frequency response. Note that the duplexer 9 is not limited by FIG. 9 in terms of the number of filters and the number of stages of the piezoelectric resonators included in the filters, and can be freely designed.

While the invention has been described in detail, the foregoing description is in all aspects illustrative and not restrictive. It is understood that numerous other modifications and variations can be devised without departing from the scope of the invention.

What is claimed is:

1. A piezoelectric resonator vibrating at a predetermined frequency, the resonator comprising:
   a substrate having a cavity formed therein; and
   a vibration portion formed in a position such that the vibration portion covers the cavity formed in the substrate,
   wherein the vibration portion includes:
      a piezoelectric body;
      an upper electrode formed in a direction of a top surface of the piezoelectric body;
      a lower electrode formed in a direction of a bottom surface of the piezoelectric body; and
      a spurious component control layer,
   wherein the spurious component control layer is formed in a position in a vicinity of a maximum distortion point in a portion in which the piezoelectric resonator is supported, and formed in a position in a vicinity of a maximum vibration point in a portion in which the piezoelectric resonator is not supported, in order to shift a frequency at which a spurious component occurs so as to prevent the spurious component from occurring between a resonance frequency and an antiresonance frequency,
   wherein the maximum distortion point in the portion in which the piezoelectric resonator is supported is a node in a vibration displacement distribution, and
   wherein the maximum vibration point in the portion in which the piezoelectric resonator is not supported is an antinode in the vibration displacement distribution.

2. The piezoelectric resonator according to claim 1, further comprising:
   a second piezoelectric body formed on a top surface of the upper electrode; and
   a second upper electrode formed on a top surface of the second piezoelectric body.

3. A filter having two or more piezoelectric resonators of claim 2 connected in a ladder form.

4. A duplexer comprising:
   a transmission filter having two or more piezoelectric resonators of claim 2 connected in a ladder form;
   a reception filter having two or more piezoelectric resonators of claim 2 connected in a ladder form; and
   a phase-shift circuit for connecting the transmission filter and the reception filter.

5. The piezoelectric resonator according to claim 1, wherein the cavity penetrates the substrate.

6. A filter having two or more piezoelectric resonators of claim 5 connected in a ladder form.

7. A duplexer comprising:
   a transmission filter having two or more piezoelectric resonators of claim 5 connected in a ladder form;
   a reception filter having two or more piezoelectric resonators of claim 5 connected in a ladder form; and
   a phase-shift circuit for connecting the transmission filter and the reception filter.

8. The piezoelectric resonator according to claim 1, wherein an acoustic mirror is provided between the lower electrode and the substrate, the acoustic mirror being structured by alternately laminating a high acoustic impedance layer and a low acoustic impedance layer.

9. A filter having two or more piezoelectric resonators of claim 8 connected in a ladder form.

10. A duplexer comprising:
    a transmission filter having two or more piezoelectric resonators of claim 8 connected in a ladder form;
    a reception filter having two or more piezoelectric resonators of claim 8 connected in a ladder form; and
    a phase-shift circuit for connecting the transmission filter and the reception filter.

11. A filter having two or more piezoelectric resonators of claim 1 connected in a ladder form.

12. A duplexer comprising:
    a transmission filter having two or more piezoelectric resonators of claim 1 connected in a ladder form;
    a reception filter having two or more piezoelectric resonators of claim 1 connected in a ladder form; and
    a phase-shift circuit for connecting the transmission filter and the reception filter.

13. A piezoelectric resonator vibrating at a predetermined frequency, the resonator comprising:
a substrate having a cavity formed therein; and
a vibration portion formed in a position such that the vibration portion covers the cavity formed in the substrate,
wherein the vibration portion includes:
a piezoelectric body;
an upper electrode formed in a direction of a top surface of the piezoelectric body;
a lower electrode formed in a direction of a bottom surface of the piezoelectric body; and
a spurious component control layer,
wherein the spurious component control layer is formed in a position in a vicinity of a maximum vibration point in a portion in which the piezoelectric resonator is supported, and formed in a position in a vicinity of a maximum vibration point in a portion in which the piezoelectric resonator is not supported, in order to shift a frequency at which a spurious component occurs so as to prevent the spurious component from occurring between a resonance frequency and an antiresonance frequency,
wherein the maximum vibration point in the portion in which the piezoelectric resonator is supported is a node in a vibration displacement distribution, and
wherein the maximum vibration point in the portion in which the piezoelectric resonator is not supported is an antinode in the vibration displacement distribution.

14. The piezoelectric resonator according to claim 13, further comprising:
a second piezoelectric body formed on a top surface of the upper electrode; and
a second upper electrode formed on a top surface of the second piezoelectric body.

15. A filter having two or more piezoelectric resonators of claim 14 connected in a ladder form.

16. A duplexer comprising:
a transmission filter having two or more piezoelectric resonators of claim 14 connected in a ladder form;
a reception filter having two or more piezoelectric resonators of claim 14 connected in a ladder form; and
a phase-shift circuit for connecting the transmission filter and the reception filter.

17. The piezoelectric resonator according to claim 13, wherein the cavity penetrates the substrate.

18. A filter having two or more piezoelectric resonators of claim 17 connected in a ladder form.

19. A duplexer comprising:
a transmission filter having two or more piezoelectric resonators of claim 17 connected in a ladder form;
a reception filter having two or more piezoelectric resonators of claim 17 connected in a ladder form; and
a phase-shift circuit for connecting the transmission filter and the reception filter.

20. The piezoelectric resonator according to claim 13, wherein an acoustic mirror is provided between the lower electrode and the substrate, the acoustic mirror being structured by alternately laminating a high acoustic impedance layer and a low acoustic impedance layer.

21. A filter having two or more piezoelectric resonators of claim 20 connected in a ladder form.

22. A duplexer comprising:
a transmission filter having two or more piezoelectric resonators of claim 20 connected in a ladder form;
a reception filter having two or more piezoelectric resonators of claim 20 connected in a ladder form; and
a phase-shift circuit for connecting the transmission filter and the reception filter.

23. A filter having two or more piezoelectric resonators of claim 13 connected in a ladder form.

24. A duplexer comprising:
a transmission filter having two or more piezoelectric resonators of claim 13 connected in a ladder form;
a reception filter having two or more piezoelectric resonators of claim 13 connected in a ladder form; and
a phase-shift circuit for connecting the transmission filter and the reception filter.

* * * * *